(12) United States Patent
Liu et al.

(10) Patent No.: US 12,193,255 B2
(45) Date of Patent: Jan. 7, 2025

(54) DISPLAY PANEL, METHOD OF MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tingliang Liu, Beijing (CN); Xiangdan Dong, Beijing (CN); Junxi Wang, Beijing (CN); Yi Zhang, Beijing (CN); Ming Hu, Beijing (CN); Mengqi Wang, Beijing (CN); Siyu Wang, Beijing (CN); Shun Zhang, Beijing (CN); Lulu Yang, Beijing (CN); Jie Dai, Beijing (CN); Huijuan Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 932 days.

(21) Appl. No.: 17/265,057

(22) PCT Filed: Apr. 30, 2020

(86) PCT No.: PCT/CN2020/088374
§ 371 (c)(1),
(2) Date: Feb. 1, 2021

(87) PCT Pub. No.: WO2021/217606
PCT Pub. Date: Nov. 4, 2021

(65) Prior Publication Data
US 2021/0384466 A1 Dec. 9, 2021

(51) Int. Cl.
*H10K 50/844* (2023.01)
*H10K 59/131* (2023.01)
*H10K 71/00* (2023.01)

(52) U.S. Cl.
CPC ........ *H10K 50/844* (2023.02); *H10K 59/131* (2023.02); *H10K 71/00* (2023.02)

(58) Field of Classification Search
CPC .. H10K 50/844; H10K 59/131; H10K 59/124; G09F 9/30; G09F 9/33
See application file for complete search history.

(56) References Cited

U.S. PATENT DOCUMENTS

2015/0109544 A1   4/2015   Yeo et al.
2019/0004360 A1*  1/2019   Aoki ................... H10K 77/111
(Continued)

FOREIGN PATENT DOCUMENTS

CN   104751747 A   7/2015
CN   105976718 A   9/2016
(Continued)

OTHER PUBLICATIONS

Extended European Search Report of EP Application No. 20900751.7, 8 pages.

*Primary Examiner* — Marcos D. Pizarro
*Assistant Examiner* — Tiberiu Dan Onuta
(74) *Attorney, Agent, or Firm* — MUNCY, GEISSLER, OLDS & LOWE, P.C.

(57) ABSTRACT

A display panel, a method of manufacturing the display panel and a display device are provided in the present disclosure. The display panel includes: a substrate, a functional film layer arranged on the substrate, a first bending region capable of being bent along a first direction, a second bending region capable of being bent along a second direction, and a third bending region located between the first (Continued)

bending region and the second bending region. The first direction intersects the second direction. The functional film layer includes a non-hollowed region located in at least one of the first bending region and the second bending region, and a part of the functional film layer located in the third bending region includes a plurality of functional via holes spaced from each other.

18 Claims, 16 Drawing Sheets

(56) References Cited

U.S. PATENT DOCUMENTS

2019/0273124 A1* 9/2019 Leng ............... H10K 77/111
2020/0176696 A1* 6/2020 Dai ................. H10K 59/173

FOREIGN PATENT DOCUMENTS

| CN | 206003771 U | | 3/2017 | |
|---|---|---|---|---|
| CN | 106935728 A | * | 7/2017 | ......... H01L 51/0097 |
| CN | 109360832 A | | 2/2019 | |
| CN | 209418505 U | | 9/2019 | |
| CN | 110867472 A | | 3/2020 | |
| EP | 3291321 A1 | | 3/2018 | |
| WO | WO2019223776 A1 | | 11/2019 | |

* cited by examiner

DISPLAY PANEL, METHOD OF MANUFACTURING THE SAME AND DISPLAY DEVICE

CROSS-REFERENCE TO RELATED APPLICATION

This application is the U.S. national phase of PCT Application No. PCT/CN2020/088374 filed on Apr. 30, 2020, the disclosure of which is incorporated in their entirety by reference herein.

TECHNICAL FIELD

The present disclosure relates to the field of display technology, in particular to a display panel, a method of manufacturing the display panel and a display device.

BACKGROUND

An active-matrix organic light emitting diode (AMOLED) display panel has gradually replaced a conventional liquid crystal display and is widely used in a mobile phone screen, a computer monitor or a full-color computer due to its characteristics such as high response speed, high contrast, large viewing angle.

In order to achieve a full-screen display, a screen of the AMOLED display may be bent at left, right, upper and lower bezels to achieve a bezel-free display effect.

SUMMARY

An object of the present disclosure is to provide a display panel, a method of manufacturing the display panel and a display device.

In one aspect, a display panel is provided in the present disclosure, including: a substrate, a functional film layer arranged on the substrate, a first bending region capable of being bent along a first direction, a second bending region capable of being bent along a second direction, and a third bending region located between the first bending region and the second bending region. The first direction intersects the second direction. The functional film layer includes a non-hollowed region located in at least one of the first bending region and the second bending region, and a part of the functional film layer located in the third bending region includes a plurality of functional via holes spaced from each other.

In a possible embodiment of the present disclosure, the functional film layer includes a first conductive pattern including a plurality of first conductive via holes located in at least one of the first bending region, the second bending region and the third bending region.

In a possible embodiment of the present disclosure, the functional film layer further includes: a first inorganic layer stacked with the first conductive pattern, the first inorganic layer includes a plurality of first inorganic via holes located in at least one of the first bending region, the second bending region and the third bending region, and an orthographic projection of each of the plurality of first inorganic via holes on the substrate does not overlap with an orthographic projection of each of the plurality of first conductive via holes on the substrate.

In a possible embodiment of the present disclosure, the functional film layer further includes: a first organic layer and a second conductive pattern, the first organic layer is located between the first conductive pattern and the second conductive pattern, the second conductive pattern includes a plurality of second conductive via holes located in at least one of the first bending region, the second bending region and the third bending region, and an orthographic projection of each of the plurality of first conductive via holes on the substrate does not overlap with an orthographic projection of each of the plurality of second conductive via holes on the substrate.

In a possible embodiment of the present disclosure, an orthographic projection of the first conductive pattern on the substrate and an orthographic projection of the second conductive pattern on the substrate overlap with each other in a first overlapping region, the first conductive pattern and the second conductive pattern are coupled to each other in the first overlapping region, and an orthographic projection of the first overlapping region on the substrate does not overlap with an orthographic projection of the third bending region on the substrate.

In a possible embodiment of the present disclosure, along an direction perpendicular to an extension direction of the first conductive pattern, a width of the first conductive pattern in the third bending region is larger than both a width of the first conductive pattern in the first bending region and a width of the first conductive pattern in the second bending region.

In a possible embodiment of the present disclosure, the display panel further includes an inlet line region, and along a direction approaching the inlet line region, a width of the first conductive pattern along the first direction gradually increases.

In a possible embodiment of the present disclosure, the display panel further includes an outlet line of a data line, an orthographic projection of the outlet line of the data line on the substrate and an orthographic projection of the functional film layer on the substrate overlap with each other in a second overlapping region, and the second overlapping region is located in at least one of the first bending region, the second bending region and the third bending region.

In a possible embodiment of the present disclosure, the display panel further includes a transistor, and a source electrode and a drain electrode of the transistor are arranged in a same layer as the first conductive pattern.

In a possible embodiment of the present disclosure, a diameter of each of the plurality of functional via holes in the third bending region along a third direction is identical to a diameter of each of the plurality of functional via holes in the third bending region along a fourth direction.

In a possible embodiment of the present disclosure, a part of the functional film layer located in the first bending region includes a plurality of functional via holes spaced from each other, and a diameter of each of the plurality of functional via holes in the first bending region along a third direction is larger than a diameter of each of the plurality of functional via holes in the first bending region along a fourth direction.

In a possible embodiment of the present disclosure, the plurality of functional via holes include a first via hole and a second via hole, and along the fourth direction, a diameter of the first via hole is different from a diameter of the second via hole.

In a possible embodiment of the present disclosure, a part of the functional film layer in the second bending region includes a plurality of functional via holes spaced from each other, and a diameter of each of the plurality of functional via holes in the second bending region along a fourth direction is larger than a diameter of each of the plurality of functional via holes in the second bending region along a third direction.

In a possible embodiment of the present disclosure, the plurality of functional via holes include a third via hole and a fourth via hole, and along the third direction, a diameter of the third via hole is different from a diameter of the fourth via hole.

In a possible embodiment of the present disclosure, a part of the functional film layer located in the first bending region includes a plurality of functional via holes spaced from each other, and the number of the functional via holes distributed in the first bending region gradually increases along a direction from the first bending region to the third bending region.

In a possible embodiment of the present disclosure, a part of the functional film layer located in the second bending region includes a plurality of functional via holes spaced from each other, and the number of the functional via holes distributed in the second bending region gradually increases along a direction from the second bending region to the third bending region.

In a possible embodiment of the present disclosure, the functional film layer includes a positive power signal line film layer or a negative power signal line film layer.

In a possible embodiment of the present disclosure, the functional film layer includes a positive power signal line film layer and a negative power signal line film layer, and the display panel further includes: a gate driving circuit, and an orthographic projection of the gate driving circuit on the substrate is located between an orthographic projection of the positive power signal line film layer on the substrate and an orthographic projection of the negative power signal line film layer on the substrate.

In a possible embodiment of the present disclosure, the first bending region includes a first partial display region and a first partial peripheral wiring region, and/or, the second bending region includes a second partial display region and a second partial peripheral wiring region.

In a possible embodiment of the present disclosure, the third bending region is a transition region from the first bending region to the second bending region.

In a possible embodiment of the present disclosure, the third bending region does not overlap with a display region.

In a possible embodiment of the present disclosure, the display panel further includes a cofferdam including a first part located in the first bending region and a second part located in the second bending region.

In a possible embodiment of the present disclosure, the cofferdam further includes a third part located in the third bending region.

In another aspect, based on the above technical solution of the display panel, a display device including the display panel is further provided in the present disclosure.

In another aspect, based on the above technical solution of the display panel, a method of manufacturing a display panel is further provided in the present disclosure. The display panel includes a first bending region capable of being bent along a first direction, a second bending region capable of being bent along a second direction, and a third bending region located between the first bending region and the second bending region, the first direction intersects the second direction, the method includes: fabricating a functional film layer on a substrate, where the functional film layer includes a non-hollowed region located in at least one of the first bending region and the second bending region, and a part of the functional film layer located in the third bending region includes a plurality of functional via holes spaced from each other.

BRIEF DESCRIPTION OF THE DRAWINGS

The following drawings are provided to facilitate the understanding of the present disclosure, and constitute a portion of the present disclosure. These drawings and the following embodiments are for illustrative purposes only, but shall not be construed as limiting the present disclosure. In these drawings.

FIG. 1b is an enlarged schematic view of a part A in FIG. 1a;

DETAILED DESCRIPTION

In order to further explain a display panel, a method of manufacturing the display panel and a display device in the embodiments of the present disclosure, a detailed description will be given below with reference to the accompanying drawings in the specification.

In order to achieve a full-screen display, a screen of the AMOLED display may be bent at left, right, upper and lower bezels to achieve a bezel-free display effect. In a case that the screen is bent at left, right, upper and lower bezels, a bending transition region, i.e., an intersection region generated during being bent along an up-down direction and being bent along an left-right direction, may be generated. The bending transition region is a high risk region where a crack occurs in a functional film layer of the screen due to being bent both along the up-down direction and along the left-right direction.

Figure 1A:
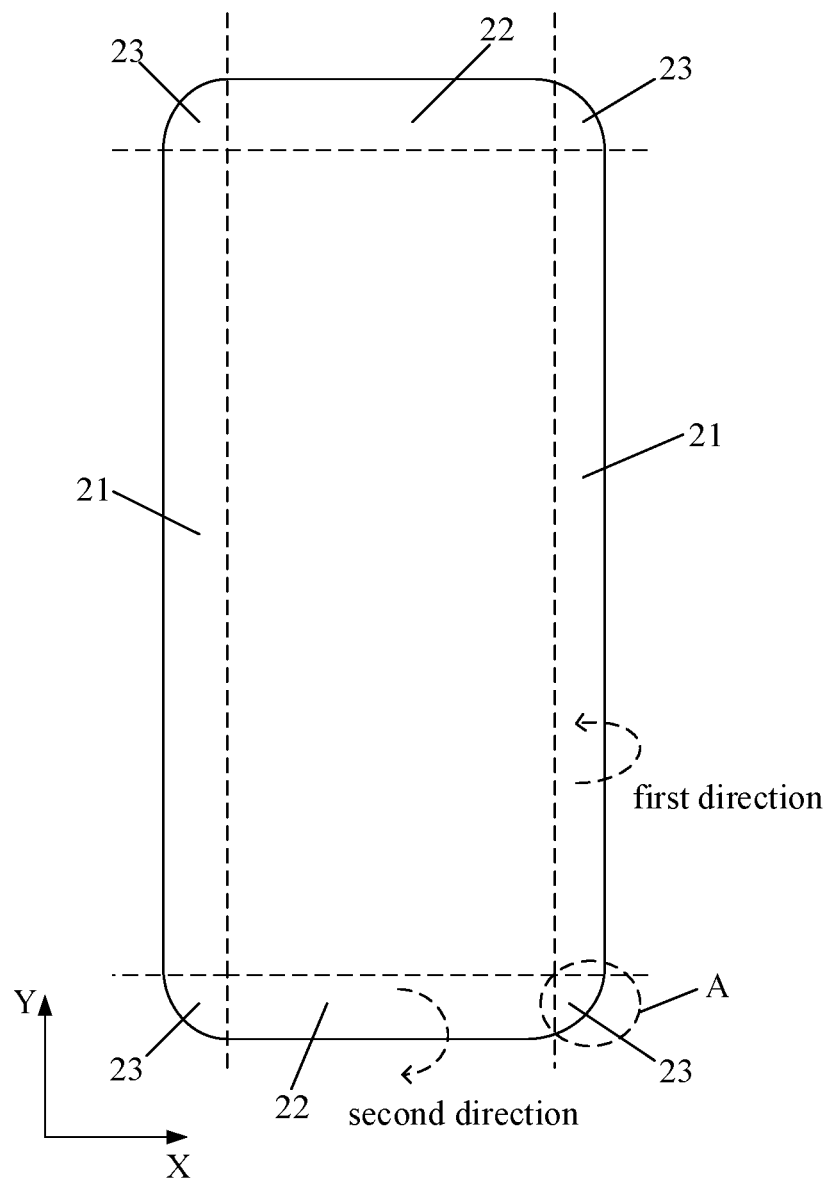
FIG. 1a is a first schematic structural view of a display panel according to an embodiment of the present disclosure.

As shown in FIG. 1a, a display panel is provided in the present disclosure. A long edge of the display panel may be bent to left or right along a first direction to form a first bending region 21. A short edge of the display panel may be bent up or down along a second direction to form a second bending region 21. A third bending region 23 is formed at four corners of the display panel. The third bending region 23 may be bent simultaneously along the first direction and the second direction, thus, there may be many stress wrinkles in the third bending region.

Figure 1B:
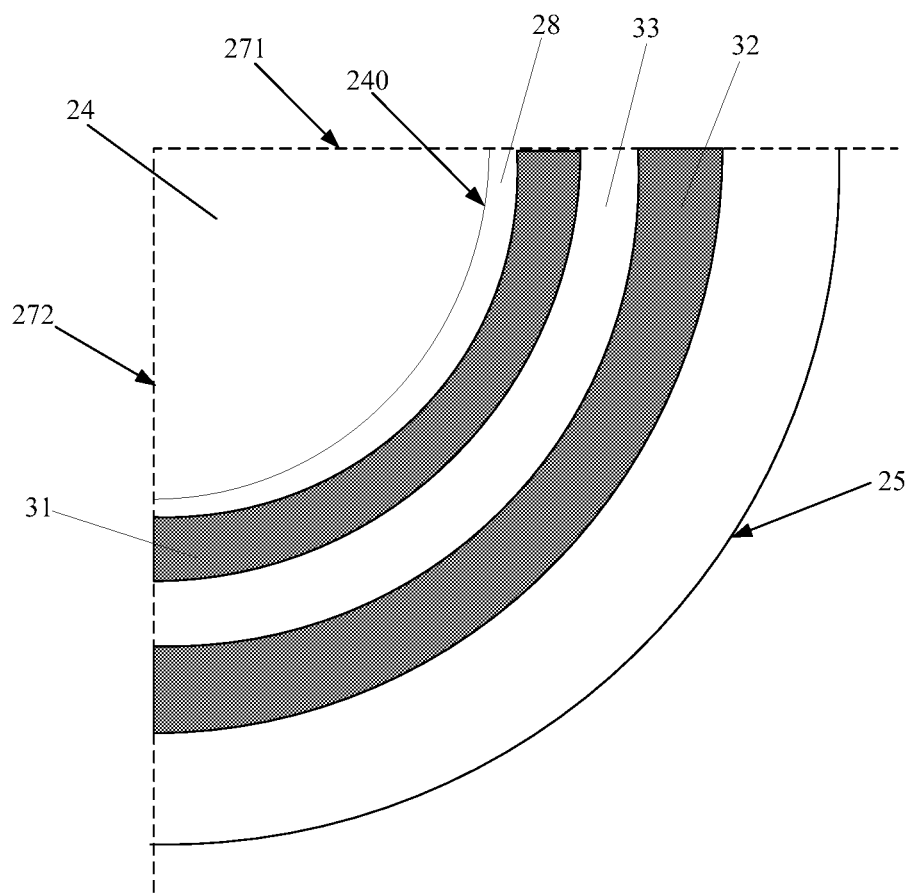
Figure 3:
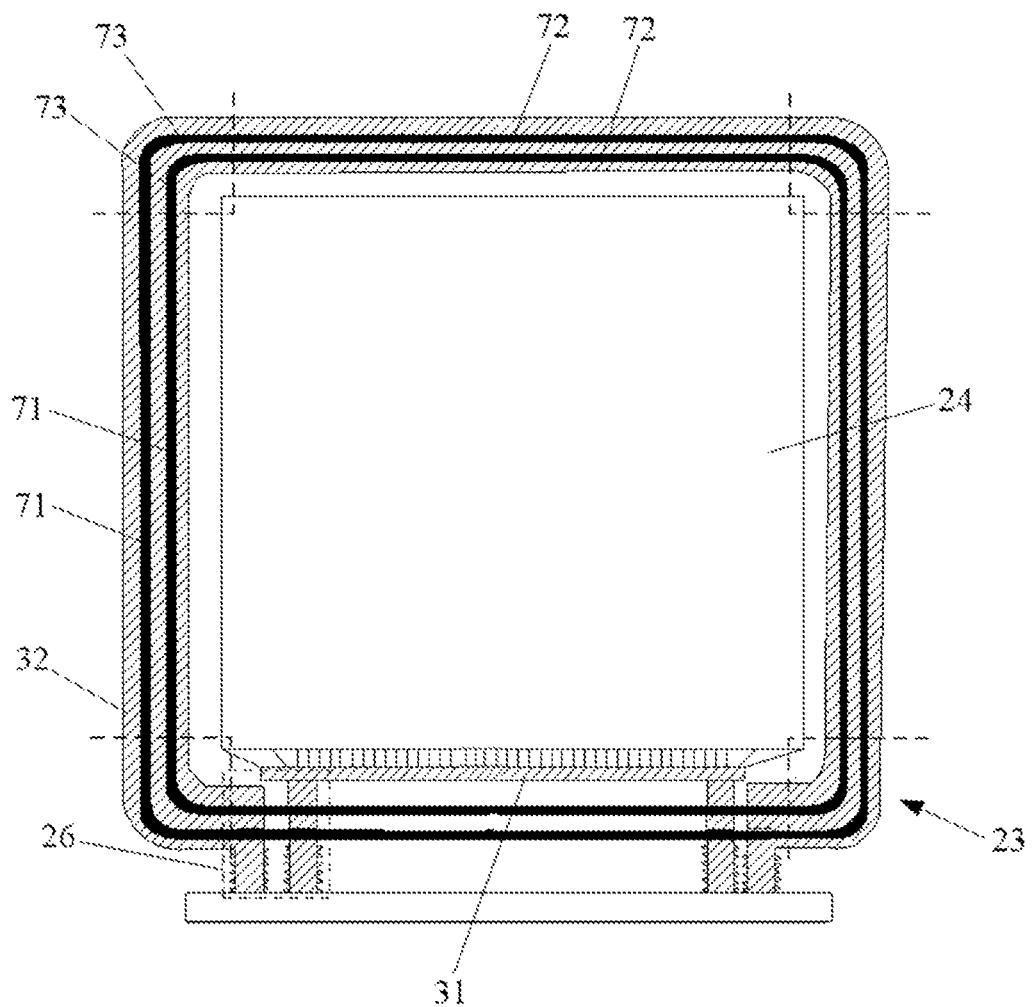
FIG. 3 is a third schematic structural view of the display panel according to an embodiment of the present disclosure.

As shown in FIG. 1b and FIG. 3, both a part of a display region 24 and a part of a bezel region of the display panel enter the third bending region 23. Since most of functional patterns set in the display region 24 have a small area, there may be not stress wrinkles in the part of the display region that enters the third bending region generally. The part of the bezel region includes a fan-out region 28, a region where a positive power signal line film layer 31 is laid out, a region where a gate driving circuit 33 is laid out, a region where a negative power signal line film layer 32 is laid out, and a cutting region. There is a metal pattern in all the above regions except for the cutting region. Each of both the positive power signal line film layer 31 and the negative power signal line film layer 32 of which a width is approximately 0.2 mm~0.4 mm (endpoint values are included) is a large-area metal layer, and the large-area metal layer is prone to cracking in a double-bent state, thereby affecting adversely the characteristics of the display screen. Moreover, the third bending region is further provided with an inorganic layer, the flexibility of the inorganic layer is poor, and cracks are also prone to occur in the double-bent state, thereby affecting adversely the characteristics of the display screen.

It should be appreciated that, a display region boundary 240, a physical boundary 25, a first boundary line 271 and a second boundary line 272 are shown in FIG. 1b.

Therefore, it is necessary to perform a special design for each functional pattern located in the third bending region 23 to improve the characteristics of a display product.

Referring to FIG. 1a to FIG. 4, a display panel is provided in an embodiment of the present disclosure, including: a substrate, a functional film layer 30 arranged on the substrate, a first bending region 21 capable of being bent along a first direction, a second bending region 22 capable of being bent along a second direction, and a third bending region 23 located between the first bending region 21 and the second bending region 22. The first direction intersects the second direction. The functional film layer 30 includes a non-hollowed region located in at least one of the first bending region 21 and the second bending region 22, and a part of the functional film layer 30 located in the third bending region 23 includes a plurality of functional via holes spaced from each other 300.

To be specific, in a possible embodiment, the substrate may be a flexible substrate, for example, the substrate includes a polyimide (PI) substrate.

For example, the first direction includes a direction of being bent to left or right with a Y direction as an axis of rotation, and the second direction includes a direction of being bent up or down with an X direction as an axis of rotation. The first bending region 21 may be bent to left or right along the first direction, and specifically include a left bezel region and a right bezel region of the display panel. The second bending region 22 may be bent up or down along the second direction, and specifically include an upper bezel region and a lower bezel region of the display panel. The third bending region 23 may be bent simultaneously both along the first direction and the second direction, and formed as a mixed stress region. The third bending region 23 may specifically include four corner regions of the display panel, i.e., an upper left corner region, a lower left corner region, an upper right corner region and a lower right corner region.

The display panel includes the functional film layer 30. The functional film layer 30 may specifically include, but be not limited to, a conductive pattern and/or an inorganic insulation film layer.

For example, the functional film layer 30 includes the non-hollowed region located in at least one of the first bending region 21 and the second bending region 22. The functional film layer 30 includes the hollowed region located in at least one of the first bending region 21 and the second bending region 22. A part of the functional film layer 30 located in the third bending region 23 includes the plurality of functional via holes spaced from each other 300 that form the hollowed region in the third bending region 23.

Figure 19:
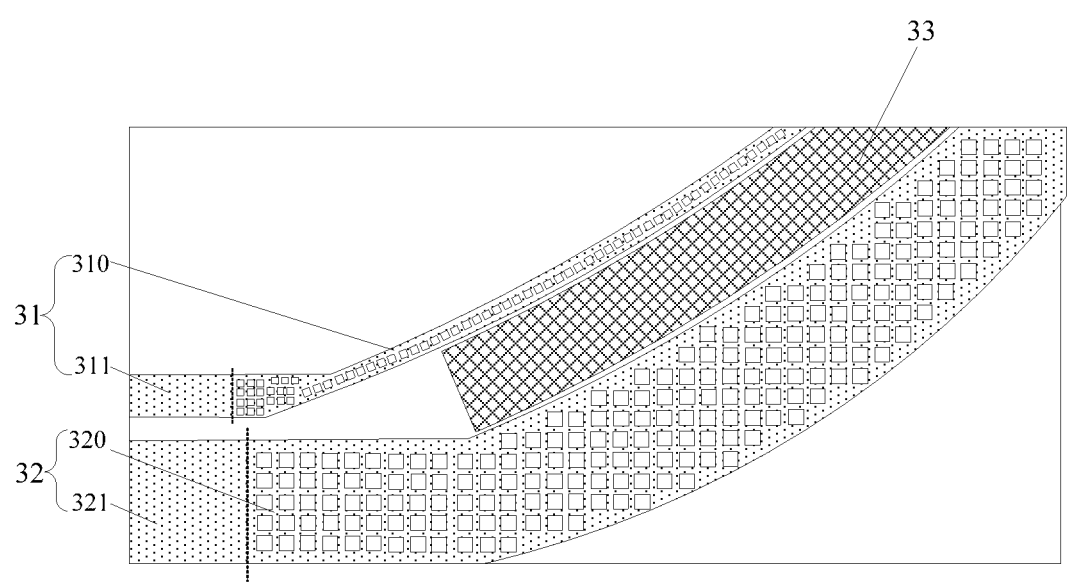
FIG. 19 is a schematic diagram of a layout of a positive power signal line film layer and a negative power signal line film layer according to an embodiment of the present disclosure.

As shown in FIG. 19, taking that the functional film layer 30 including the positive power signal line film layer 31 and the negative power signal line film layer 32 as an example, the positive power signal line film layer 31 includes a first hollowed region 310 and a first non-hollowed region 311, and the negative power signal line film layer 32 includes a second hollowed region 320 and a second non-hollowed region 321.

In the display panel of the embodiment of the present disclosure, a part of the functional film layer 30 located in the third bending region 23 is set to include the plurality of functional via holes spaced from each other 300, such that the functional film layer 30 may well release the stress generated in the third bending region 23, thereby effectively reducing a probability of cracks occurring and cracks transmitting in the functional film layer 30 in the third bending region 23. Therefore, the reliability of the functional film layer 30 in a double bending region (i.e., the third bending region 23) is improved in the display panel of the embodiment of the present disclosure, thereby facilitating the achievement of a special shape and appearance and the improvement of the reliability of the display panel.

Figure 5:
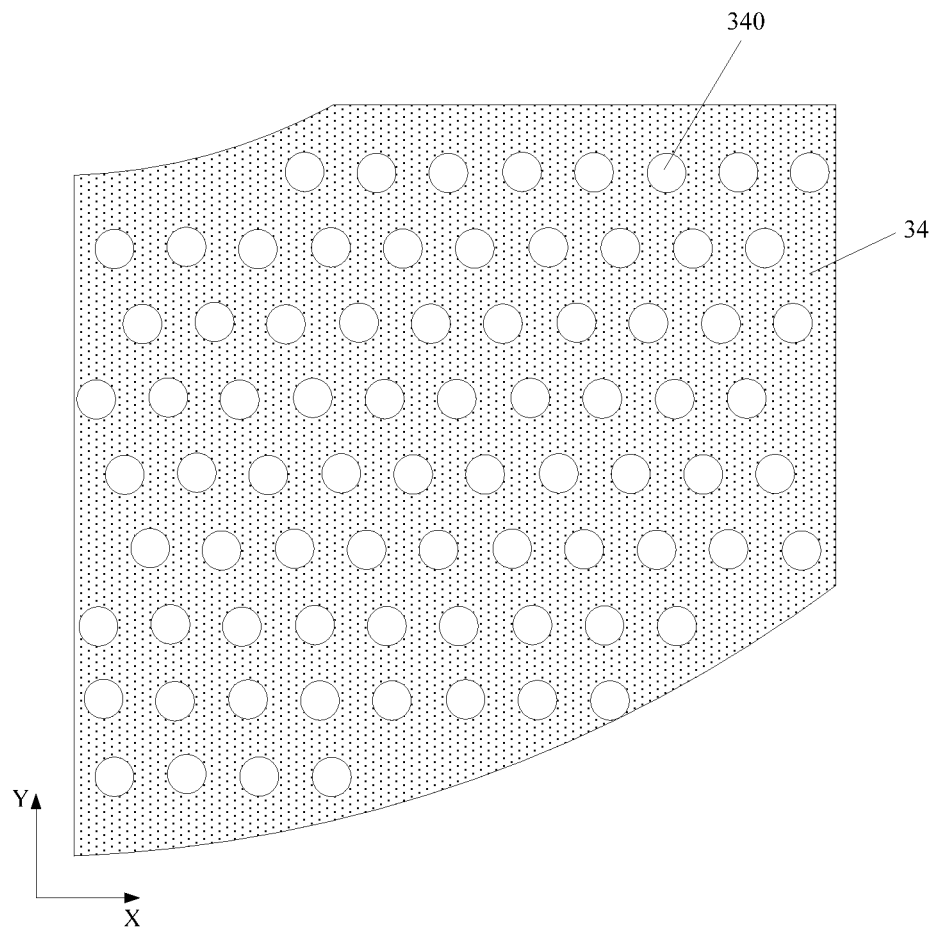
FIG. 5 is a schematic diagram of a first conductive pattern provided with a first conductive via hole in the third bending region according to an embodiment of the present disclosure.

As shown in FIG. 5, in some embodiments, the functional film layer 30 includes a first conductive pattern 34 including a plurality of first conductive via holes 340 located in at least one of the first bending region 21, the second bending region 22 and the third bending region 23.

To be specific, there are various specific structures for the functional film layer 30. For example, the functional film layer 30 includes the first conductive pattern 34, and the first conductive pattern 34 includes the plurality of first conductive via holes 340 located in one or more of the first bending region 21, the second bending region 22 and the third bending region 23.

The first conductive pattern 34 includes the plurality of first conductive via holes 340, and the first conductive pattern 34 is located in one or more of the first bending region 21, the second bending region 22 and the third bending region 23, such that the generated stress due to being bent may be well released, thereby effectively reducing a probability of cracks occurring and cracks transmitting in the first conductive pattern 34 in one or more of the first bending region 21, the second bending region 22 and the third bending region 23.

Figure 6:
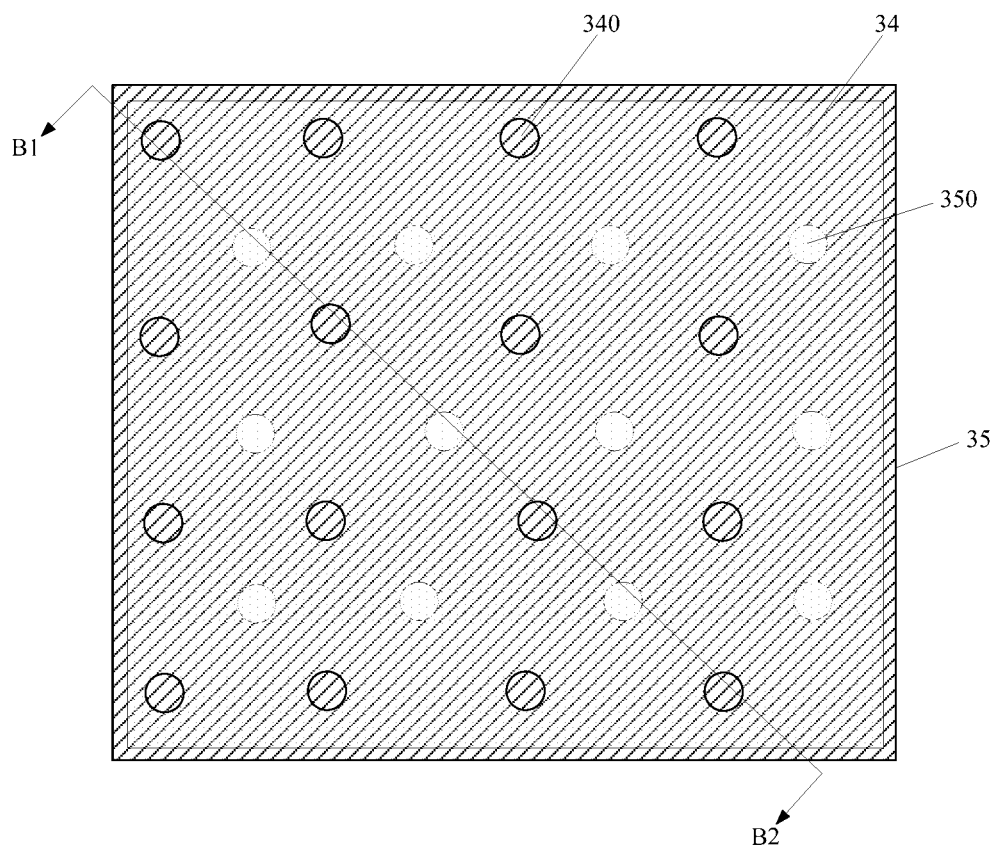
FIG. 6 is a schematic diagram of a stacked structure of the first conductive pattern and a first inorganic layer according to an embodiment of the present disclosure.
Figure 7:
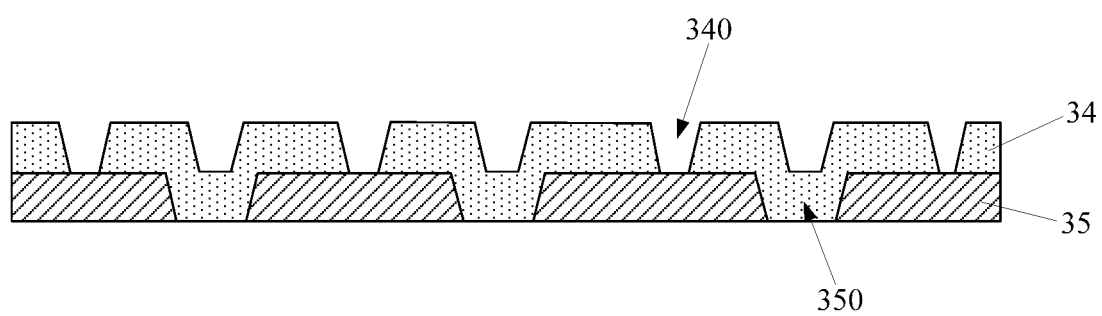
FIG. 7 is a schematic cross-sectional view along a B1B2 direction in FIG. 6.

As shown in FIG. 6 and FIG. 7, in some embodiments, the functional film layer 30 further includes: a first inorganic layer 35 stacked with the first conductive pattern 34, the first inorganic layer 35 includes a plurality of first inorganic via holes 350 located in at least one of the first bending region 21, the second bending region 22 and the third bending region 23, and an orthographic projection of each of the plurality of first inorganic via holes 350 on the substrate does not overlap with an orthographic projection of each of the plurality of first conductive via holes 340 on the substrate.

To be specific, the functional film layer 30 may specifically include the first conductive pattern 34 and the first inorganic layer 35 that are stacked. For example, the first conductive pattern 34 is located between the substrate and the first inorganic layer 35, or, the first inorganic layer 35 is located between the substrate and the first conductive pattern 34.

The first inorganic layer 35 includes the plurality of first inorganic via holes 350 located in one or more of the first bending region 21, the second bending region 22 and the third bending region 23, such that the generated stress due to being bent may be well released by the first inorganic layer 35, thereby effectively reducing a probability of cracks occurring and cracks transmitting in the first inorganic layer 35 in one or more of the first bending region 21, the second bending region 22 and the third bending region 23.

The orthographic projection of each of the plurality of first inorganic via holes 350 on the substrate not overlapping the orthographic projection of each of the plurality of first conductive via holes 340 on the substrate specifically includes that the orthographic projection of each of the plurality of first inorganic via holes 350 on the substrate does not overlap the orthographic projection of each of the plurality of first conductive via holes 340 on the substrate in one or more of the first bending region 21, the second bending region 22 and the third bending region 23.

The orthographic projection of each of the plurality of first inorganic via holes 350 on the substrate does not overlap with the orthographic projection of each of the plurality of first conductive via holes 340 on the substrate, such that, in a direction perpendicular on the substrate, the plurality of first conductive via holes 340 and the plurality of first inorganic via holes 350 are staggered. This distribution makes the functional via holes 300 (i.e., the first inorganic via holes 350 and the first conductive via holes 340) included on the functional film layer 30 be evenly distributed, which is more beneficial for the functional film layer 30 to release the stress generated due to being bent.

Moreover, in a case that the first conductive pattern 34 is made of a metal material, the metal material and an inorganic material for fabricating the inorganic layer have different lattice sizes, such that an interface gap is provided in an interface where the first conductive pattern 34 is in contact with the first inorganic layer 35. In a case that a stress transmits in the first inorganic layer 35, the stress may be well released in the interface where the first conductive pattern 34 is in contact with the first inorganic layer 35.

Figure 8:
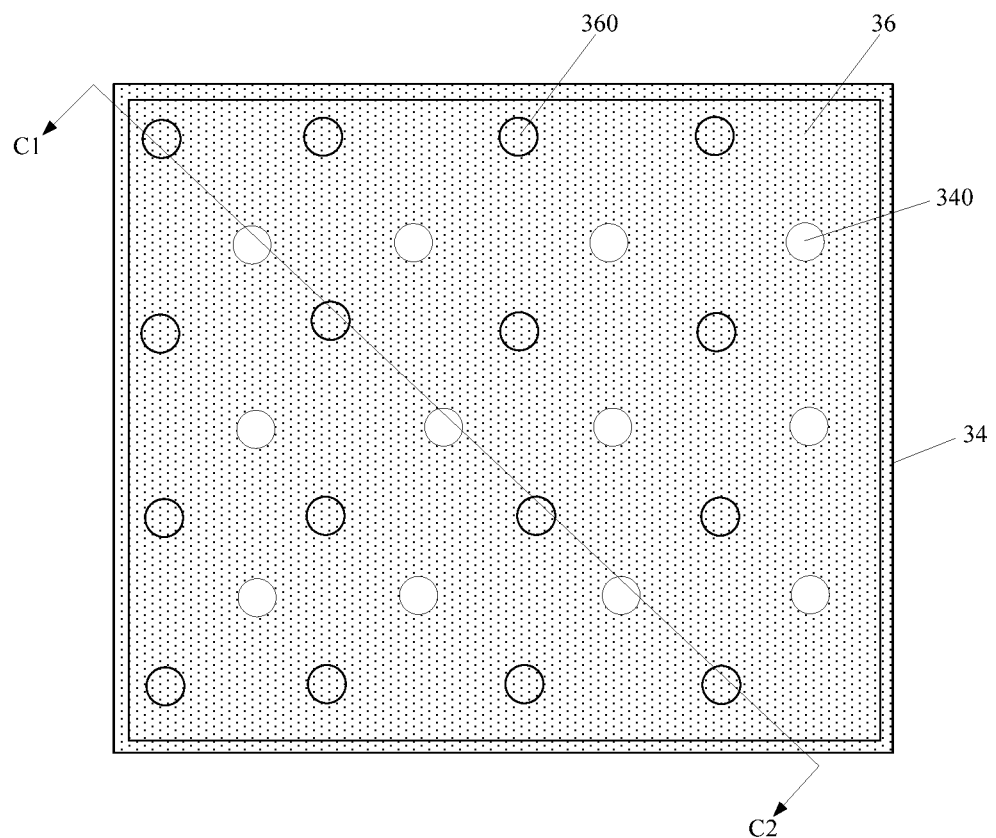
FIG. 8 is a schematic diagram of a stacked structure of the first conductive pattern and a second conductive pattern according to an embodiment of the present disclosure.
Figure 9:
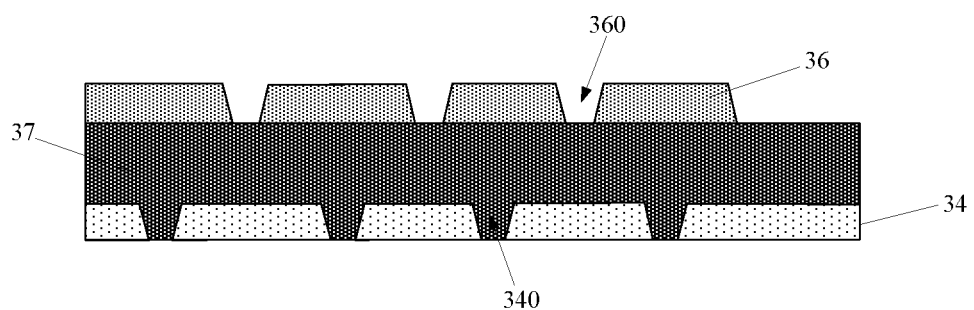
FIG. 9 is a schematic cross-sectional view along a C1C2 direction in FIG. 8.

As shown in FIG. 8 and FIG. 9, in some embodiments, the functional film layer 30 further includes: a first organic layer 37 and a second conductive pattern 36, the first organic layer 37 is located between the first conductive pattern 34 and the second conductive pattern 36, the second conductive pattern 36 includes a plurality of second conductive via holes 360 located in at least one of the first bending region 21, the second bending region 22 and the third bending region 23, and an orthographic projection of each of the plurality of first conductive via holes 340 on the substrate does not overlap with an orthographic projection of each of the plurality of second conductive via holes 360 on the substrate.

To be specific, the functional film layer 30 includes the first conductive pattern 34, the second conductive pattern 36 disposed opposite to each other, and the first organic layer 37 located between the first conductive pattern 34 and the second conductive pattern 36.

The second conductive pattern 36 includes the plurality of second conductive via holes 360 located in one or more of the first bending region 21, the second bending region 22 and the third bending region 23, such that the generated stress due to being bent may be well released by the second conductive pattern, thereby effectively reducing a probability of cracks occurring and cracks transmitting in the second conductive pattern 36 in one or more of the first bending region 21, the second bending region 22 and the third bending region 23.

The orthographic projection of each of the plurality of first conductive via holes 340 on the substrate not overlapping the orthographic projection of each of the plurality of second conductive via holes 360 on the substrate specifically includes that the orthographic projection of each of the plurality of first conductive via holes 340 on the substrate does not overlap with the orthographic projection of each of the plurality of second conductive via holes 360 on the substrate in one or more of the first bending region 21, the second bending region 22 and the third bending region 23.

The orthographic projection of each of the plurality of first conductive via holes 340 on the substrate does not overlap with the orthographic projection of each of the plurality of second conductive via holes 360 on the substrate, such that, in the direction perpendicular on the substrate, the plurality of first conductive via holes 340 and the plurality of second conductive via holes 360 are staggered. Such that the functional via holes 300 (i.e., the first conductive via holes and the second conductive via holes) included on the functional film layer 30 are evenly distributed, which is more beneficial for the functional film layer 30 to release the stress generated due to being bent.

It should be appreciated that, since the first organic layer 37 generally has good flexibility, there is generally no via holes formed on the first organic layer 37.

There are various specific structures and layouts for the first conductive pattern 34 and the second conductive pattern 36. The following is an example of the specific structure and layout of the first conductive pattern 34 and the second conductive pattern 36.

Figure 10:
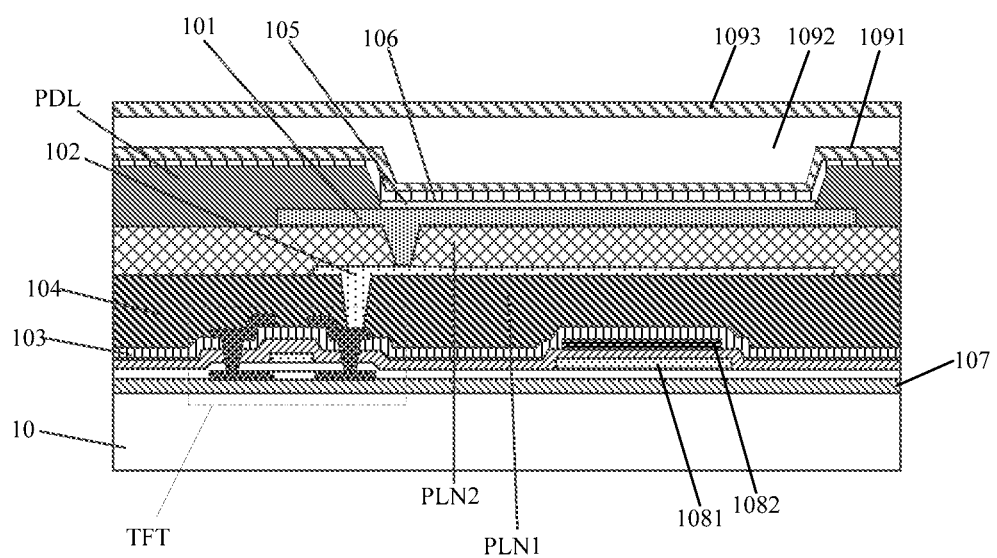
FIG. 10 is a schematic cross-sectional view of a part of a display region of the display panel according to an embodiment of the present disclosure.

As shown in FIG. 10, in some embodiments, the display panel further includes: a plurality of sub-pixel driving circuits, each of the plurality of sub-pixel driving circuits includes a capacitor structure and a plurality of transistors TFTs. The plurality of transistors TFTs include at least one driving transistor having a driving function and a plurality of switch transistors having a switch function. During operation, the plurality of transistors TFTs operate together to output a driving signal from an output terminal of the driving transistor. Each of the plurality of the transistors TFTs includes an active layer, a gate electrode, a source electrode and a drain electrode. The capacitor structure includes a first electrode plate 1081 and a second electrode plate 1082 disposed opposite to each other, and may be used as a storage capacitor in the sub-pixel driving circuit.

An anode pattern 101 is arranged on a side of the plurality of sub-pixel driving circuits away from the substrate 10, and in a one-to-one correspondence with the sub-pixel driving circuit.

A plurality of light-emitting elements is arranged on a side of the anode pattern 101 away from the substrate 10, and in a one-to-one correspondence with the plurality of sub-pixel driving circuits. Each of the plurality of light-emitting elements may include an organic light-emitting material layer 105 and a cathode 106 that are stacked, and the organic light-emitting material layer 105 is located between the corresponding anode pattern 101 and the cathode 106. It should be appreciated that, the organic light-emitting material layer 105 may include, but be not limited to, an electron injection layer, an electron transport layer, a light-emitting layer, a hole transport layer, and a hole injection layer that are stacked.

A plurality of conductive connecting parts 102 are arranged between the anode pattern 101 and the sub-pixel driving circuit, each of the plurality of conductive connecting parts 102 is respectively coupled to the corresponding anode pattern 101 and the corresponding sub-pixel driving circuit. In more detail, the driving transistor includes the source electrode and the drain electrode arranged within a same layer and made of a same material, one of the source electrode and the drain electrode is used as an input electrode of the driving transistor, the other of the source electrode and the drain electrode is used as an output electrode of the driving transistor, and the conductive connecting part 102 is coupled to the output electrode of the driving transistor. It should be appreciated that, a transistor TFT in FIG. 10 may be used as the driving transistor or as a switch transistor connected between the output electrode of the driving transistor and the anode pattern 101.

A second insulation layer 103 and a third insulation layer 104 are included. The source electrode and the drain electrode of the transistor TFT are both located on a surface of the second insulation layer 103 away from the substrate 10, and the conductive connection part 102 is located on a surface of the third insulation layer 104 away from the substrate 10.

It should be appreciated that, as shown in FIG. 10, the display panel further includes: a buffer layer 107, a first planarization layer PLN1, a second planarization layer PLN2 and a pixel definition layer PDL. The display panel further includes an encapsulation structure including a first inorganic encapsulation layer 1091, an organic encapsulation layer 1092 and a second inorganic encapsulation layer 1093 that are sequentially stacked along a direction away from the substrate 10.

In addition, it should be appreciated that, both the conductive connection part 102 and the second planarization layer PLN2 included in the display panel are optional structures.

When the display panel is in operation, the driving signal generated by each sub-pixel driving circuit is transmitted to the corresponding anode pattern 101 through the corresponding conductive connection part 102, and the organic light-emitting material layer 105 emits light under a control of the anode pattern 101 together with the cathode 106, thereby realizing the display function of the display substrate.

When the display panel adopts the above specific structure, the first conductive pattern 34 and the second conductive pattern 36 may be formed in a same patterning process with some functional structures of the display panel.

For example, the first conductive pattern 34 and the gate electrode of the transistor TFT are made of a same material, and formed on a surface of a first gate insulation layer of the display panel away from the substrate 10. That is, the first conductive pattern 34 and the gate electrode of the transistor TFT are located within a same layer and made of the same material. The second conductive pattern 36, the source electrode and the drain electrode of the transistor TFT are made of a same material and formed on the surface of the second insulation layer 103 of the display panel away from the substrate 10. That is, the second conductive pattern 36, the source electrode and the drain electrode of the transistor TFT are located within a same layer and made of the same material.

For example, the first conductive pattern 34 and the second electrode plate 1082 of the capacitor structure are made of a same material, and formed on a surface of a second gate insulation layer of the display panel away from the substrate 10. That is, the first conductive pattern 34 and the second electrode plate 1082 of the capacitor structure are located within a same layer and made of the same material. The second conductive pattern 36, the source electrode and the drain electrode of the transistor TFT are made of a same material and formed on the surface of the second insulation layer 103 of the display panel away from the substrate 10. That is, the second conductive pattern 36, the source electrode and the drain electrode of the transistor TFT are located within the same layer and made of the same material.

For example, the first conductive pattern 34, the source electrode and the drain electrode of the transistor TFT are made of a same material, and formed on the surface of the second insulation layer 103 of the display panel away from the substrate 10. That is, the first conductive pattern 34, the source electrode and the drain electrode of the transistor TFT are located within a same layer and made of the same material. The second conductive pattern 36 and the conductive connection part 102 are made of a same material and formed on the surface of the third insulation layer 104 away from the substrate 10. That is, the second conductive pattern 36 and the conductive connection part 102 are located within a same layer and made of the same material.

For example, the functional film layer 30 includes the first conductive pattern 34, the second conductive pattern 36 and the third conductive pattern. The first conductive pattern 34 and the gate electrode of the transistor TFT are made of a same material, and formed on the surface of the first gate insulation layer of the display panel away from the substrate 10. That is, the first conductive pattern 34 and the gate electrode of the transistor TFT are located within a same layer and made of the same material. The second conductive pattern 36 and the second electrode plate 1082 of the capacitor structure are made of a same material and formed on the surface of the second gate insulation layer of the display panel away from the substrate 10. That is, the second conductive pattern 36 and the second electrode plate 1082 of the capacitor structure are located within a same layer and made of the same material. The third conductive pattern, the source electrode and the drain electrode of the transistor TFT are made of a same material and formed on the surface of the second insulation layer 103 of the display panel away from the substrate 10. That is, the third conductive pattern, the source electrode and the drain electrode of the transistor TFT are located within a same layer and made of the same material.

It should be appreciated that, the above-mentioned "same layer" refers to a layer structure formed where a film layer for forming a specific pattern is formed by using a same film forming process, and then one patterning process is performed on the film layer by using a same mask. Depending on the specific pattern, one patterning process may include a plurality of exposure, development or etching processes, and the specific patterns formed in the layer structure may be continuous or discontinuous, and these specific patterns may also be at different heights or have different thickness.

In the above embodiment, all the first conductive pattern 34, the second conductive pattern 36, the third conductive pattern and other functional structures included in the display panel are arranged within a same layer and made of a same material, such that the first conductive pattern 34, the second conductive pattern 36, the third conductive pattern and other functional structures may be formed in a same patterning process, and the first conductive pattern 34, the second conductive pattern 36 and the third conductive pattern may be formed without adding a new patterning process, thereby effectively simplifying a manufacturing process of the display substrate and reducing a manufacturing cost of the display substrate.

In some embodiments, an orthographic projection of the first conductive pattern 34 on the substrate 10 and an orthographic projection of the second conductive pattern 36 on the substrate 10 overlap with each other in a first overlapping region, the first conductive pattern 34 and the second conductive pattern 36 are coupled to each other in the first overlapping region, and an orthographic projection of the first overlapping region on the substrate 10 does not overlap with an orthographic projection of the third bending region 23 on the substrate 10.

For example, the first conductive pattern 34 and the second conductive pattern 36 may be, but not limited to, formed together as the positive power signal line film layer 31 or the negative power signal line film layer 32 in the display panel. Since the first conductive pattern 34 and the second conductive pattern 36 are coupled to each other in the first overlapping region, the resistance on the first conductive pattern 34 and the second conductive pattern 36 may be effectively reduced, such that in a case that the first conductive pattern 34 and the second conductive pattern 36 are used as the positive power signal line film layer 31 or the negative power signal line film layer 32, the resistance on the positive power signal line film layer 31 or the negative power signal line film layer 32 may be effectively reduced.

In addition, the orthographic projection of the first overlapping region on the substrate 10 does not overlap with the orthographic projection of the third bending region 23 on the substrate 10, such that bent stresses in two directions applied to the first overlapping region may be avoided, thereby ensuring the coupling performance between the first conductive pattern 34 and the second conductive pattern 36.

Figure 11:
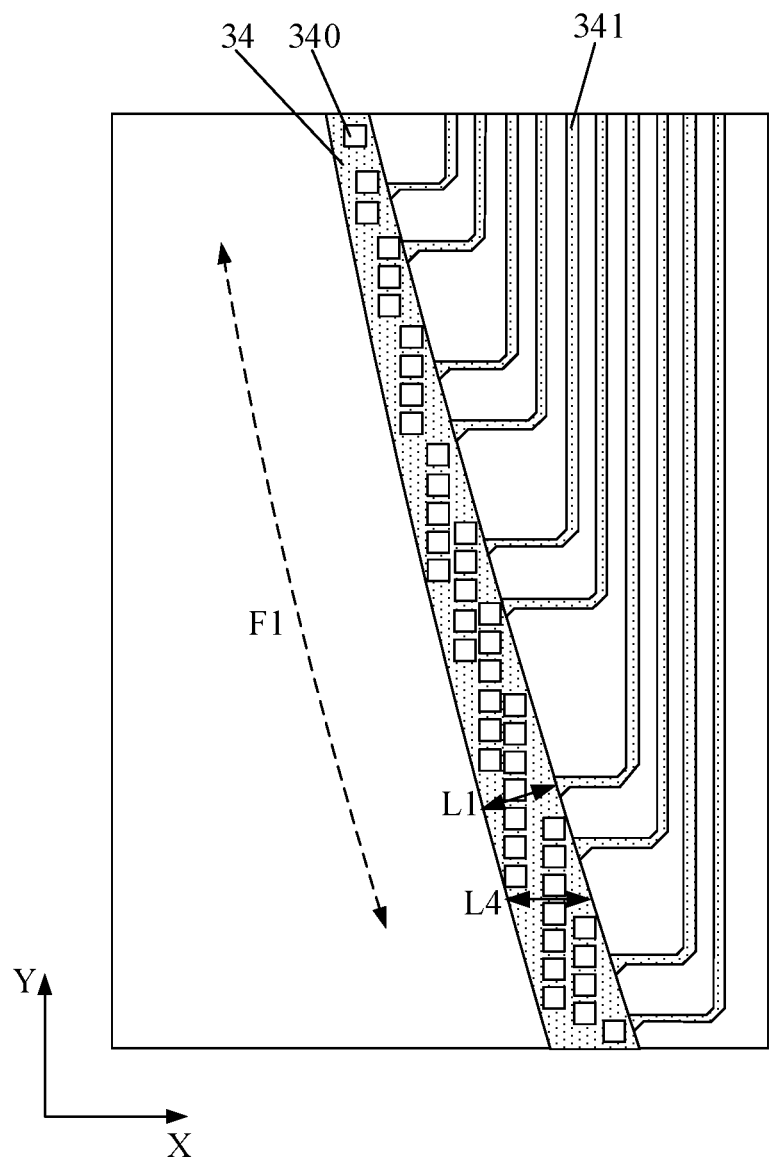
FIG. 11 is a schematic diagram of the first conductive pattern located in a first bending region at a left bezel of the display panel according to an embodiment of the present disclosure.
Figure 12:
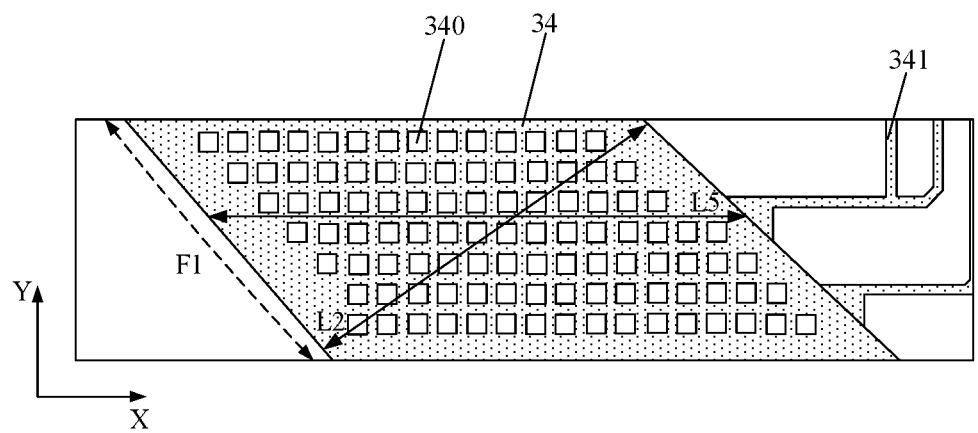
FIG. 12 is a schematic diagram of the first conductive pattern located in a third bending region at a lower left corner of the display panel according to an embodiment of the present disclosure.
Figure 13:
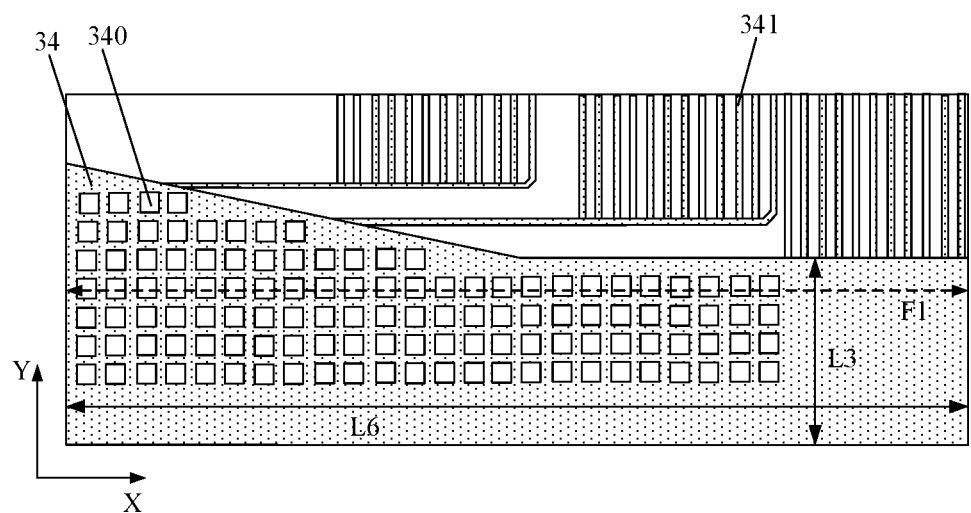
FIG. 13 is a schematic diagram of the first conductive pattern located in a second bending region at a lower bezel of the display panel according to an embodiment of the present disclosure.
Figure 14:
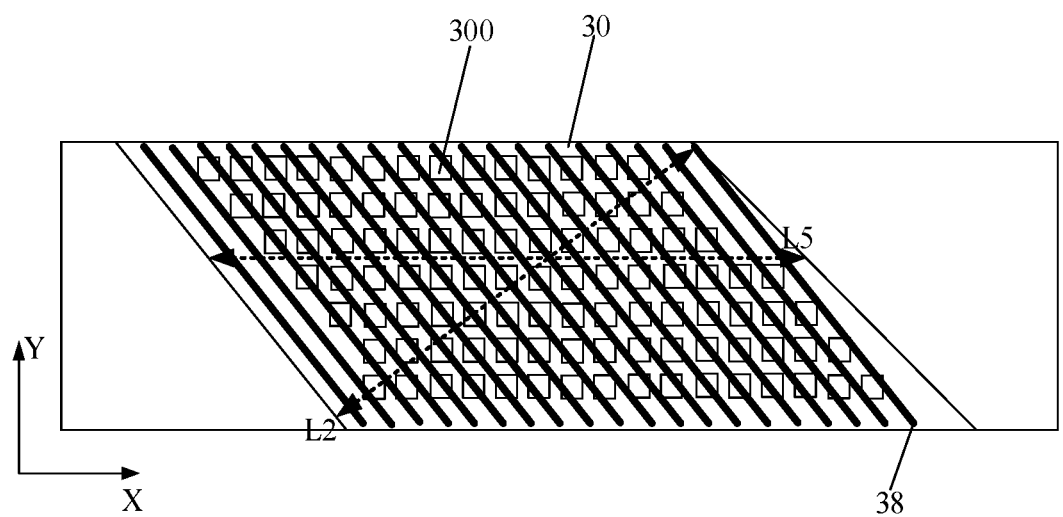
FIG. 14 is a schematic diagram of the functional film layer in the third bending region overlapping an outlet line of a data line according to an embodiment of the present disclosure.

As shown in FIG. 11 to FIG. 13, in some embodiments, along an direction perpendicular to an extension direction of the first conductive pattern 34 (e.g., F1 direction shown in FIG. 11 to FIG. 13), and a width L2 of the first conductive pattern 34 in the third bending region 23 is larger than both a width L1 of the first conductive pattern 34 in the first bending region 21 and a width L3 of the first conductive pattern 34 in the second bending region 22.

To be specific, there are various specific structures for the first conductive pattern 34. For example, along the direction perpendicular to the extension direction of the first conductive pattern 34, and the width of the first conductive pattern 34 in the third bending region 23 is larger than both the width of the first conductive pattern 34 in the first bending region 21 and the width of the first conductive pattern 34 in the second bending region 22. Since the third bending region 23 corresponds to the corner region of the display panel, the first conductive pattern 34 may have a larger area in the corner region by adopting this arrangement, thereby facilitating improving the ability for the first conductive pattern 34 of withstanding a large current in the corner region.

It should be appreciated that, the first conductive pattern 34 further includes a part 341 extending to the display region, and the part 341 is electrically connected to the functional pattern in the display region. For example, in a case that the first conductive pattern 34 is used as a power signal line, and to provide a power signal for the functional pattern.

As shown in FIG. 3, FIG. 11 to FIG. 13, in some embodiments, the display panel further includes an inlet line region 26, and along a direction approaching the inlet line region 26, a width of the first conductive pattern 34 along the first direction gradually increases.

To be specific, the display panel includes the inlet line region 26, a driving chip of the display panel is used to transmit a corresponding signal to the inside of the display panel through the inlet line region 26.

Along the direction approaching the inlet line region 26, the width of the first conductive pattern 34 along the first direction gradually increases, as shown in FIG. 11 to FIGS. 13, L4, L5, and L6 gradually increases. The first conductive pattern 34 may have a larger area in the inlet line region 26 by adopting this arrangement, thereby facilitating improving the ability for the first conductive pattern 34 of withstanding a large current in the inlet line region 26.

Figure 4:
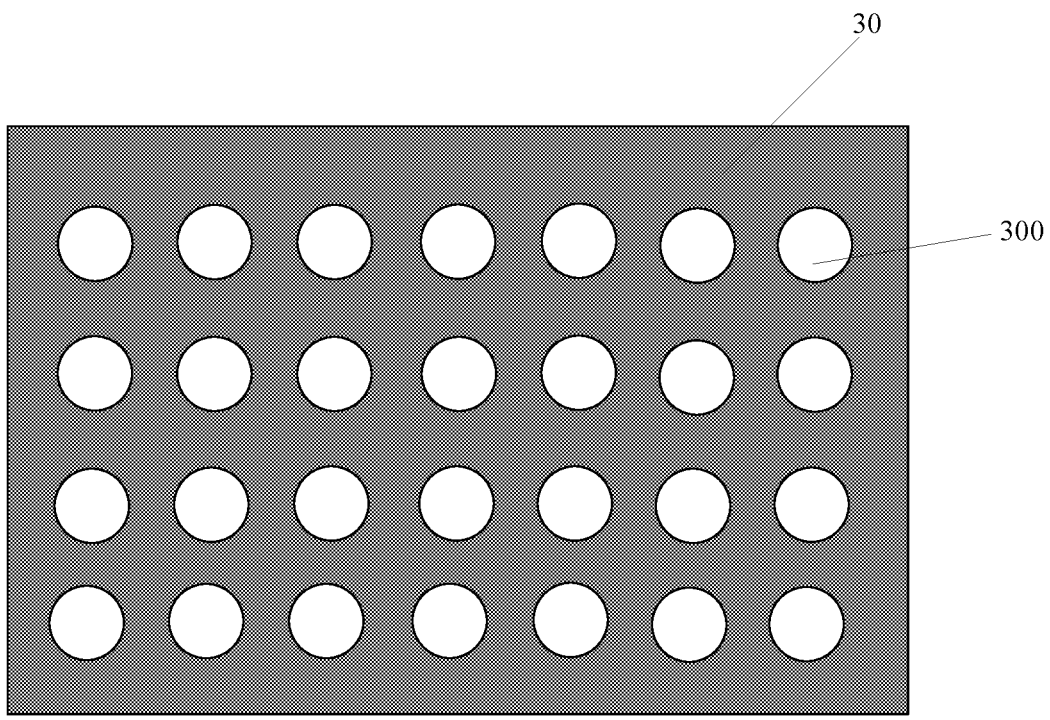
FIG. 4 is a schematic diagram of a functional film layer provided with a functional via hole in a third bending region according to an embodiment of the present disclosure.

As shown in FIG. 4, in some embodiments, the display panel further includes an outlet line 38 of a data line, an orthographic projection of the outlet line 38 of the data line on the substrate 10 and an orthographic projection of the functional film layer 30 on the substrate 10 overlap with each other in a second overlapping region, and the second overlapping region is located in at least one of the first bending region 21, the second bending region 22 and the third bending region 23.

To be specific, the display panel includes the data line located in the display region 24 and the outlet line 38 of the data line in a non-display region. The outlet line 38 of the data line is connected between the data line and the driving chip of the display panel, and used to transmit a data signal provided by the driving chip to the data line.

Taking an AMOLED display panel as an example, the AMOLED display panel has many performance specifications. A resistance capacitance (RC) loading of a data signal line is a performance specification of the AMOLED display panel, and is important for a pixel charging time of the AMOLED display panel, which has a great impact on the display performance of the display panel. Therefore, controlling the loading of the data signal line is extremely important to the display performance of the display panel.

Unlike a liquid crystal display (LCD) that uses a stable voltage to control brightness, an OLED display panel is driven by a current and requires a stable current to control the light emitting. A low-temperature poly-silicon (LTPS) process is usually used in the OLED display panel. In a case that this process is used in a medium-large-sized and high-resolution display panel, and if the load is small when controlling the display panel, the size of the display panel increases exponentially. As a pixel pitch becomes small, a part of storage capacitance Cst is sacrificed, which reduces the display performance greatly.

In more detail, in a design of the medium-large-sized and high-resolution display panel, a smaller-sized and low-resolution display panel has a large RC loading, and therefore has a large resistance voltage drop, which causes that an IR drop (i.e., a voltage drop) of the positive power signal line film layer 31 and the data line in the display panel is large in the LTPS and OLED manufacturing processes, thereby reducing the display performance of the display panel greatly. At the same time, a pixel size is getting smaller and smaller in a high-resolution panel, and a width of a signal line is greatly limited by a process condition. Thus, a part of Cst is sacrificed to ensure the arrangement of a pixel circuit structure. In order to reduce a resistance load and increase the Cst, such a manner as adding a mask or replacing a material should be adopted, which greatly increases steps of the process and product costs.

In the display panel of the above embodiment, the first conductive pattern 34 includes the plurality of first conductive via holes 340 located in at least one of the first bending region 21, the second bending region 22 and the third bending region 23, the orthographic projection of the outlet line 38 of the data line on the substrate 10 and the orthographic projection of the functional film layer 30 on the substrate 10 overlap with each other in a second overlapping region, and the second overlapping region is located in at least one of the first bending region 21, the second bending region 22 and the third bending region 23, such that in a case that the first conductive pattern 34 is used as the positive power signal line film layer 31 of the display panel, an overlapping region between the outlet line 38 of the data line and the positive power signal line film layer 31 may be greatly reduced, thereby reducing the loading of the data line connected to the outlet line 38 of the data line, and realizing a better display effect of the display panel.

It should be appreciated that, due to the large number of outlet lines of the data line, and in order to reduce the process difficulty, the outlet line 38 of the data line is generally divided into two parts respectively laid out in different film layers of the display panel. For example, one part of the outlet line 38 of the data line and the gate electrode of the transistor TFT in the display panel are arranged within a same layer and made of a same material, and the other part of the outlet line 38 of the data line and the second electrode plate of the capacitor structure in the display panel are arranged within a same layer and made of a same material.

Figure 16:
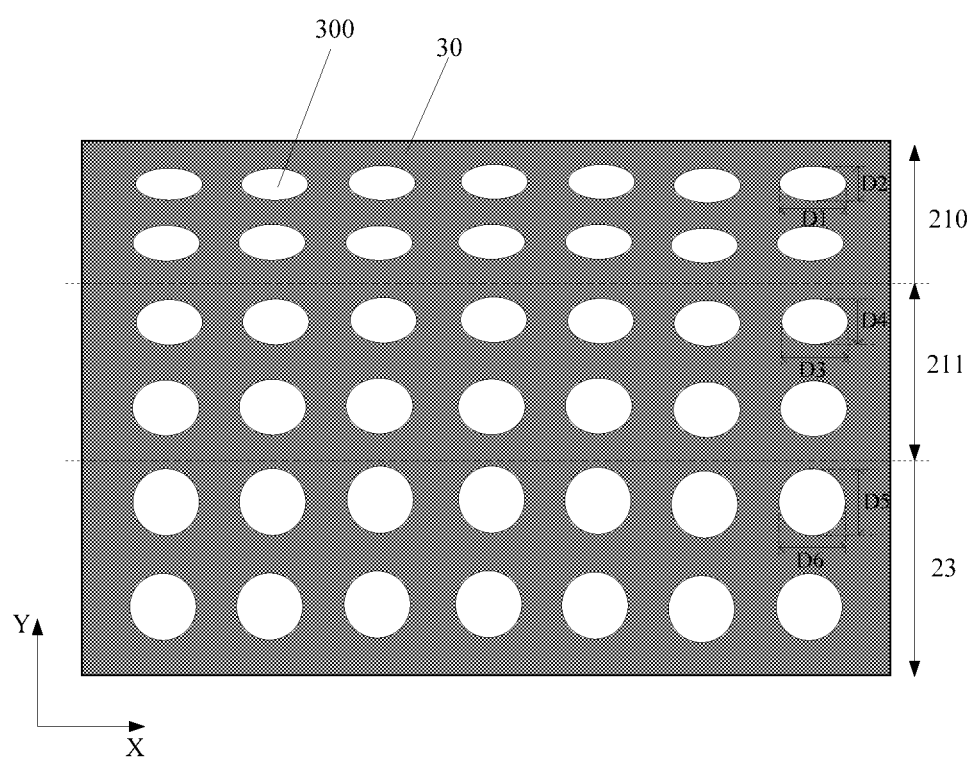
FIG. 16 is a schematic diagram of a functional via hole located in a first bending transition region according to an embodiment of the present disclosure.
Figure 18:
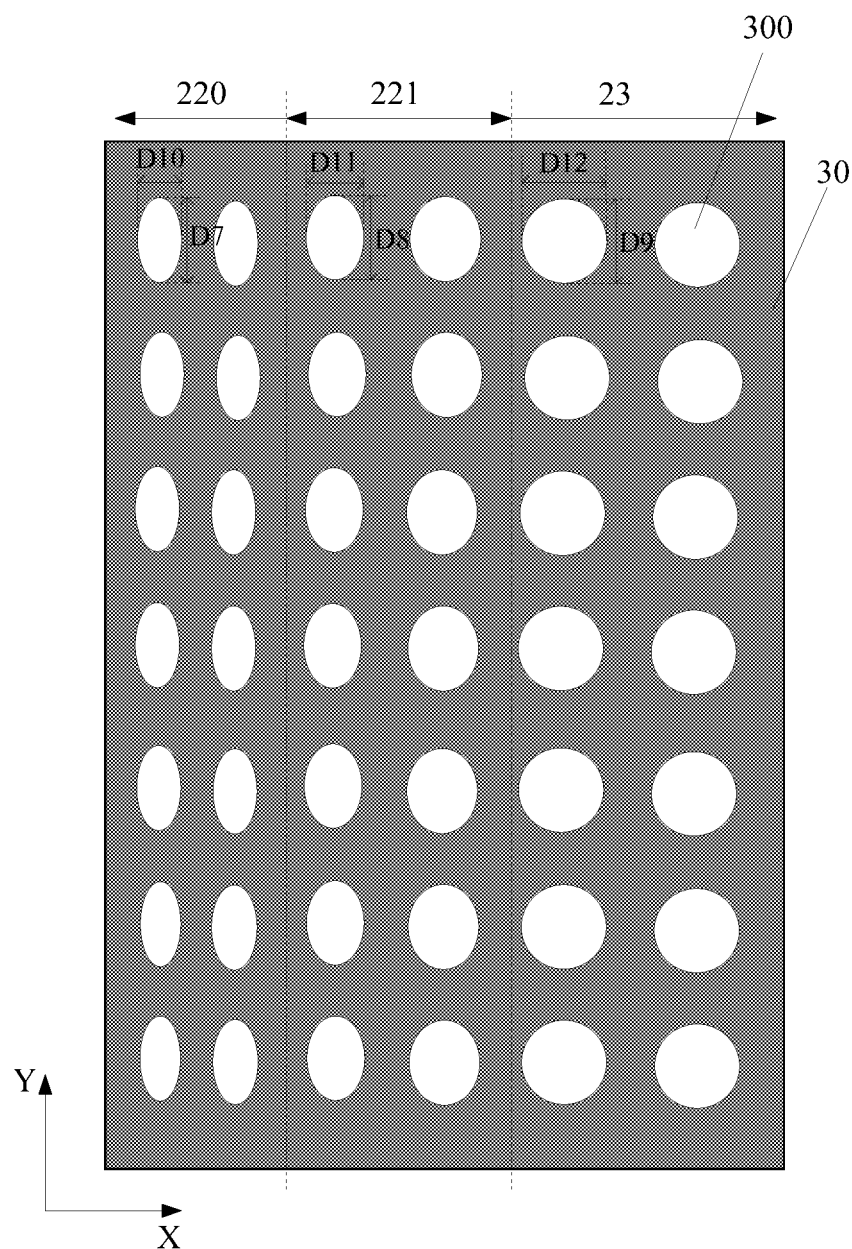
FIG. 18 is a schematic diagram of a functional via hole located in a second bending transition region according to an embodiment of the present disclosure.

As shown in FIG. 16 and FIG. 18, in some embodiments, a diameter of each of the plurality of functional via holes 300 in the third bending region 23 along a third direction is identical to a diameter of each of the plurality of functional via holes 300 in the third bending region 23 along a fourth direction.

For example, the third direction includes the X direction, and the fourth direction includes the Y direction. As shown in FIG. 16, D5 is identical to D6. As shown in FIG. 18, D9 is identical to D12.

To be specific, the third bending region 23 may be bent simultaneously both along the first direction and the second direction, that is, bent stresses both in the first direction and the second direction are applied to the third bending region 23 simultaneously, and the diameter of each of the plurality of functional via holes 300 in the third bending region 23 along the third direction is set to be identical to the diameter of each of the plurality of functional via holes 300 in the third bending region 23 along the fourth direction, such that each of the plurality of functional via holes 300 located in the third bending region 23 has a same stress releasing capability in the first direction and the second direction, that is, the stress may be well released both along the first direction and along the second direction.

Figure 15:
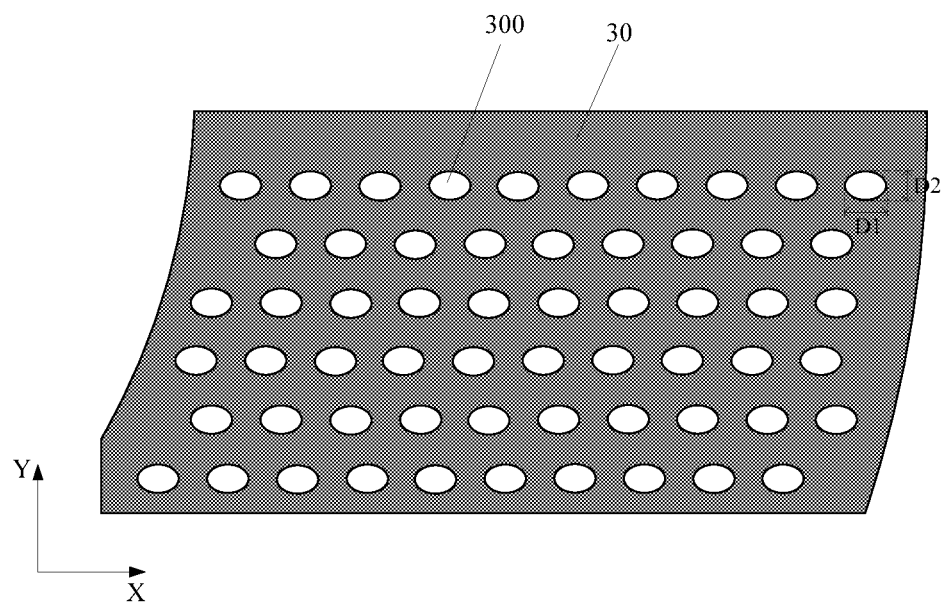
FIG. 15 is a schematic diagram of a functional via hole located in the first bending region according to an embodiment of the present disclosure.

As shown in FIG. 15, in some embodiments, a part of the functional film layer 30 located in the first bending region 21 includes a plurality of functional via holes spaced from each other 300, and a diameter D1 of each of the plurality of functional via holes 300 in the first bending region 21 along a third direction is larger than a diameter D4 of each of the plurality of functional via holes 300 in the first bending region 21 along a fourth direction. As shown in FIG. 16, D3 is larger than D4.

For example, the third direction includes the X direction, and the fourth direction includes the Y direction.

To be specific, the first bending region 21 is bent along the first direction, and a bent stress mainly along the first direction is applied to the first bending region 21, and the diameter of each of the plurality of functional via holes 300 in the first bending region 21 along the third direction is set to be larger than the diameter of each of the plurality of functional via holes 300 in the first bending region 21 along the fourth direction, such that each of the plurality of functional via holes 300 in the first bending region 21 has a larger stress releasing capability in the first direction than that in the second direction, thereby realizing the well releasing of the stress in the first direction.

Each of the plurality of functional via holes 300 in the first bending region 21 has a small size while having a good stress releasing capability by adopting the above arrangement, such that a layout space for the functional via holes 300 in the first bending region 21 is big, and there are more options for the layout number and layout position of the functional via holes 300 in the first bending region 21.

As shown in FIG. 16, in some embodiments, the plurality of functional via holes 300 in the first bending region 21 include a first via hole and a second via hole, and along the fourth direction, a diameter of the first via hole is different from a diameter of the second via hole.

To be specific, the first bending region 21 (including a first bending body region 210 and a first bending transition region 211) shown in FIG. 16 include the plurality of functional via holes 300. The plurality of functional via holes 300 may include the first via hole and the second via hole. For example, along the fourth direction, the diameter of the first via hole is D2, the diameter of the second via hole is D4.

The plurality of functional via holes in the first bending region 21 are set to include the first via hole and the second via hole, such that a reasonable layout for the first via hole and the second via hole may be achieved, and the bent stress generated in the first bending region 21 may be well released by the functional film layer.

As shown in FIG. 16, further, the first bending region 21 includes the first bending body region 210 and the first bending transition region 211 located between the first bending body region 210 and the third bending region 23. Along a direction from the first bending body region 210 to the third bending region 23, a diameter of the functional via hole 300 located in the first bending transition region 211 along the fourth direction gradually increases. As shown in FIG. 16, D4 is larger than D2, and D3 may be identical to D1.

For example, the first bending transition region 211 includes at least two rows of functional via holes 300 arranged along the fourth direction, and each row of functional via holes 300 include a plurality of functional via holes 300 spaced apart along the third direction.

The first bending region 21 includes the first bending body region 210 and the first bending transition region 211 located between the first bending body region 210 and the third bending region 23. Since the first bending transition region 211 is closer to the third bending region 23 than the first bending body region 210, the stress of the first bending transition region 211 in the second direction is larger than that of the first bending body region 210.

Along the direction from the first bending body region 210 to the third bending region 23, the diameter of the functional via hole 300 located in the first bending transition region 211 along the fourth direction is set to gradually increase, such that the closer the functional via hole 300 located in the first bending transition region 211 is to the third bending region 23, the larger the bent stress releasing capability in the second direction is, which is more conducive to improving the reliability of the functional film layer 30.

Figure 17:
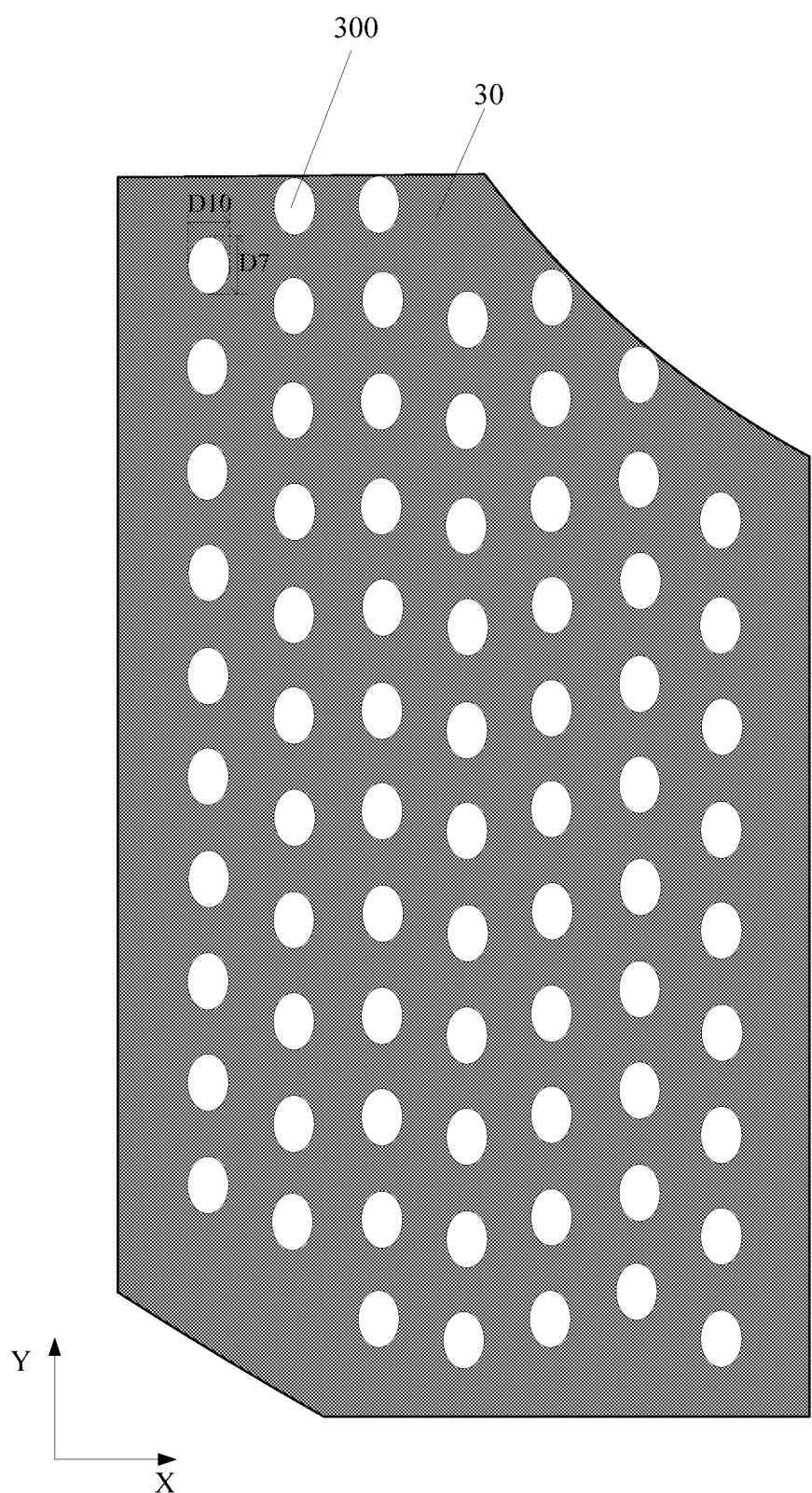
FIG. 17 is a schematic diagram of a functional via hole located in the second bending region according to an embodiment of the present disclosure.

As shown in FIG. 17, in some embodiments, a part of the functional film layer 30 located in the second bending region 22 includes a plurality of functional via holes spaced from each other 300, and a diameter D7 of each of the plurality of functional via holes 300 in the second bending region 22 along the fourth direction is larger than a diameter D10 of each of the plurality of functional via holes 300 in the second bending region 22 along the third direction.

To be specific, the second bending region 22 is bent along the second direction, and a bent stress mainly along the second direction is applied to the second bending region 22, the diameter of each of the plurality of functional via holes 300 in the second bending region 22 along the fourth direction is set to be larger than the diameter of each of the plurality of functional via holes 300 in the second bending region 22 along the third direction, such that each of the plurality of functional via holes 300 in the second bending region 22 has a larger stress releasing capability in the second direction than that in the first direction, thereby realizing the well releasing of the stress in the second direction.

Each of the plurality of functional via holes 300 in the second bending region 22 has a small size while having a good stress releasing capability by adopting the above arrangement, such that a layout space for the functional via holes 300 in the second bending region 22 is big, and there are more options for the layout number and layout position of the functional via holes 300 in the second bending region 22.

As shown in FIG. 18, in some embodiments, the plurality of functional via holes 300 in the second bending region 22 include a third via hole and a fourth via hole, and along the third direction, a diameter of the third via hole is different from a diameter of the fourth via hole.

To be specific, the second bending region 22 (including a second bending body region 220 and a second bending transition region 2121) shown in FIG. 18 include the plurality of functional via holes 300. The plurality of functional via holes 300 include the third via hole and the fourth via hole. For example, along the third direction, the diameter of the third via hole is D10, the diameter of the fourth via hole is D11.

The plurality of functional via holes 300 in the second bending region 22 are set to include the third via hole and the fourth via hole, such that a reasonable layout for the third via hole and the fourth via hole may be achieved, and the bent stress generated in the second bending region 22 may be well released by the functional film layer As shown in FIG. 18, further, the second bending region 22 includes the second bending body region 220 and the second bending transition region 221 located between the second bending body region 220 and the third bending region 23. Along a direction from the second bending body region 220 to the third bending region 23, a diameter of the functional via hole 300 located in the second bending transition region 221 along the third direction gradually increases. As shown in FIG. 18, D11 is larger than D10, and D8 may be identical to D7.

For example, the second bending transition region 221 includes at least two rows of functional via holes 300 arranged along the third direction, and each row of functional via holes 300 include a plurality of functional via holes 300 spaced apart along the fourth direction.

The second bending region 22 includes the second bending body region 220 and the second bending transition region 221 located between the second bending body region 220 and the third bending region 23. Since the second bending transition region is closer to the third bending region 23 than the second bending body region, the stress of the second bending transition region in the first direction is larger than that of the second bending body region.

Along the direction from the second bending body region 220 to the third bending region 23, the diameter of the functional via hole 300 located in the second bending transition region 221 along the third direction is set to gradually increase, such that the closer the functional via hole 300 located in the second bending transition region 221 is to the third bending region 23, the larger the bent stress releasing capability in the first direction is, which is more conducive to improving the reliability of the functional film layer 30 in the first bending region 21.

As shown in FIG. 11 and FIG. 12, in some embodiments, a part of the functional film layer 30 located in the first bending region 21 includes a plurality of functional via holes spaced from each other 300 (e.g., the first conductive via holes 340 in FIG. 11 and FIG. 12), and along a direction from the first bending region 21 to the third bending region 23, the number of the functional via holes 300 distributed in the first bending region 21 gradually increases.

To be specific, the closer a part of the first bending region 21 is to the third bending region 23, the larger the bent stress along the second direction is, along the direction from the first bending region 21 to the third bending region 23, the number of the functional via holes 300 distributed in the first bending region 21 is set to increase gradually, which is more conducive to improving the bent stress releasing capability of the part of the first bending region 21 close to the third bending region 23 and improving the reliability of the functional film layer 30.

As shown in FIG. 12 and FIG. 13, in some embodiments, a part of the functional film layer 30 located in the second bending region 22 includes a plurality of functional via holes spaced from each other 300 (e.g., the first conductive via holes 340 in FIG. 12 and FIG. 13), and along a direction from the second bending region 22 to the third bending region 23, the number of the functional via holes 300 distributed in the second bending region 22 gradually increases.

To be specific, the closer a part of the second bending region 22 is to the third bending region 23, the larger the bent stress along the first direction is, along the direction from the second bending region 22 to the third bending region 23, the number of the functional via holes 300 distributed in the second bending region 22 is set to increase gradually, which is more conducive to improving the bent stress releasing capability of the part of the second bending region 22 close to the third bending region 23 and improving the reliability of the functional film layer 30 in the second bending region 22.

It should be appreciated that, the functional via holes 300 include via holes formed on any film layer included in the functional film layer 30, such as the first conductive via holes 340 formed on the first conductive pattern 34, the first inorganic via holes 350 formed on the first inorganic layer 35 and the second conductive via holes 360 formed on the second conductive pattern 36.

In addition, the specific distribution positions of the functional via holes 300 may be set according to practical requirements, and it is beneficial to ensure that a boundary of the functional film layer 30 has a sufficient width.

In addition, there are various specific shapes for the functional via holes 300. For example, the functional via hole 300 includes a circular hole, a rectangular hole, a diamond hole, a hexagonal hole, or an octagonal hole, etc.

In some embodiments, the functional film layer 30 includes a positive power signal line film layer 31 or a negative power signal line film layer 32.

To be specific, there are various specific types for the functional film layer 30. For example, the functional film layer 30 includes the positive power signal line film layer 31 or the negative power signal line film layer 32. The positive power signal line film layer 31 is used to apply a positive power signal to sub-pixels in the display panel, and the negative power signal line film layer 32 is used to apply a negative power signal to sub-pixels in the display panel.

When the functional film layer 30 is the positive power signal line film layer 31, the functional film layer 30 may include a single-layer structure, for example, only the first conductive pattern 34.

When the functional film layer 30 is the negative power signal line film layer 32, the functional film layer 30 may include a single-layer structure or a multi-layer structure, for example: only the first conductive pattern 34, or include the first conductive pattern 34 and the second conductive pattern 36, or include the first conductive pattern 34, the second conductive pattern 36 and the third conductive pattern.

As shown in FIG. 19, in some embodiments, the functional film layer 30 includes a positive power signal line film layer 31 and a negative power signal line film layer 32, and the display panel further includes: a gate driving circuit 33, and an orthographic projection of the gate driving circuit 33 on the substrate 10 is located between an orthographic projection of the positive power signal line film layer 31 on the substrate 10 and an orthographic projection of the negative power signal line film layer 32 on the substrate 10.

To be specific, the display panel further includes the gate driving circuit 33 including a plurality of shift register units, and each shift register unit is used to apply a gate driving signal to a corresponding gate line in the display panel.

In a case that the functional film layer 30 includes the positive power signal line film layer 31 and the negative power signal line film layer 32, there are various specific layout positions for the positive power signal line film layer 31, the negative power signal line film layer 32 and the gate driving circuit 33. For example, the orthographic projection of the gate driving circuit 33 on the substrate 10 is set to be between the orthographic projection of the positive power signal line film layer 31 on the substrate 10 and the orthographic projection of the negative power signal line film layer 32 on the substrate 10, such that the positive power signal line film layer 31 and the negative power signal line film layer 32 are spaced apart by the gate driving circuit 33, which avoids the formation of parasitic capacitance due to large-area conductive patterns being too close to each other, thereby effectively improving the operation stability of the display panel.

Figure 2:
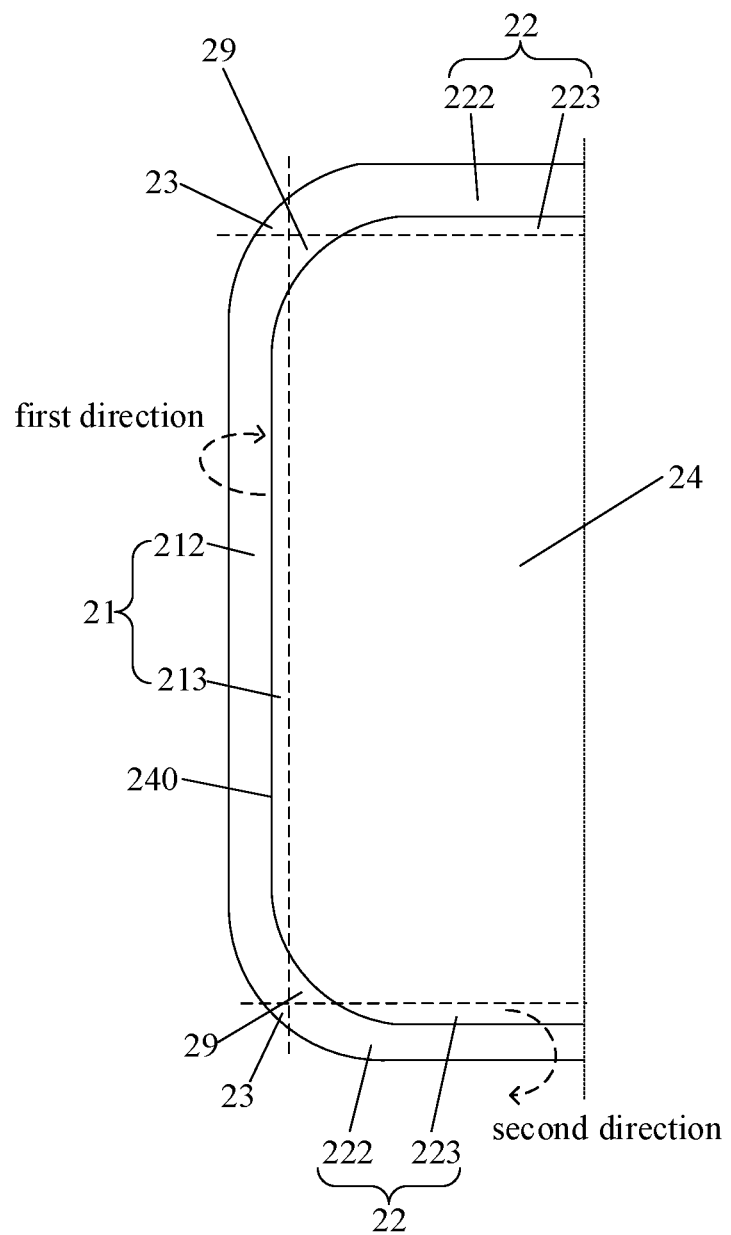
FIG. 2 is a second schematic structural view of the display panel according to an embodiment of the present disclosure.

As shown in FIG. 2, in some embodiments, the first bending region 21 may include a first partial display region 213 and a first partial peripheral wiring region 212, and/or, the second bending region 22 may include a second partial display region 223 and a second partial peripheral wiring region 222.

To be specific, the first partial display region 213 and the second partial display region 223 may be bent to a lateral side of the display panel and display at the lateral side of the display panel. An area of the first partial display region 213 and an area of the second partial display region 223 may be set according to practical requirements. For example, the area of the first partial display region 213 and the area of the second partial display region 223 may be set to be larger than 0 or equal to 0.

The display region of the display panel may be slightly bent in the first bending region 21 and the second bending region 22 by adopting the above arrangement, thereby realizing a lateral side display function of the display panel.

As shown in FIG. 1b and FIG. 2, in some embodiments, the third bending region 23 is a transition region from the first bending region 21 to the second bending region 22.

To be specific, the third bending region 23 is located between the first bending region 21 and the second bending region 22, may be bent simultaneously both along the first direction and the second direction, and a mixed stress is applied to the third bending region 23.

The bent stresses both along the first direction and the second direction are applied to the part of the functional film layer located in the third bending region 23. Therefore, the part of the functional film layer located in the third bending region 23 is designed to include holes, and the mixed stress of the functional film layer in the third bending region 23 may be well released.

It should be appreciated that, FIG. 2 shows a planarization region 29 which is not bent in any direction. In a possible embodiment, the planarization region 29 may be a non-display region for laying out signal lines.

As shown in FIG. 2, in some embodiments, the third bending region 23 may not overlap the display region.

To be specific, the third bending region 23 may be set according to practical requirements to include both the display region and a peripheral wiring region, or only include the peripheral wiring region, that is, the third bending region 23 does not overlap the display region.

In a case that the third bending region 23 does not overlap the display region, the display region is not located in the third bending region 23, and thus, a mixed stress applied to the display region may be avoided, thereby effectively improving the reliability of the display panel.

As shown in FIG. 3, in some embodiments, the display panel further includes a cofferdam including a first part 71 located in the first bending region 21 and a second part 72 located in the second bending region 22.

In some embodiments, the cofferdam further includes a third part 73 located in the third bending region 23.

To be specific, the display panel further includes the cofferdam. When a thin film encapsulation is performed on the display panel, the cofferdam may block the organic encapsulation layer to prevent the organic encapsulation layer from extending to the boundary of the display panel. There are various specific layout manners for the cofferdam. For example, the cofferdam is located in at least one of the first bending region 21, the second bending region 22 and the third bending region 23. For example, the cofferdam is in a ring-like structure, and the ring-like structure may specifically include a first ring-like portion and a second ring-like portion that are nested, both the first ring-like portion and the second ring-like portion may enclose the display region 24 of the display panel.

A display device including the display panel is further provided in an embodiment of the present disclosure.

In the display panel of the above-mentioned embodiment, a part of the functional film layer 30 located in the third bending region 23 is set to include the plurality of functional via holes spaced from each other 300, such that the functional film layer 30 may well release the stress generated in the third bending region 23, thereby effectively reducing the probability of cracks occurring and cracks transmitting in the functional film layer 30 in the third bending region 23. Therefore, the reliability of the functional film layer 30 in the double bending region (i.e., the third bending region 23) is improved in the display panel of the above-mentioned embodiment, thereby facilitating the achievement of the special shape and appearance and the improvement of reliability of the display panel. When the display device includes the display panel of the above-mentioned embodiment, it also has the above-mentioned beneficial effects, which will not be repeated herein.

It should be appreciated that, the display device may be any product or component having a display function, such as a television, a monitor, a digital photo frame, a mobile phone, a tablet computer.

A method of manufacturing the display panel is further provided in an embodiment of the present disclosure. The display panel includes the first bending region 21 capable of being bent along the first direction, the second bending region 22 capable of being bent along the second direction, and the third bending region 23 located between the first bending region 21 and the second bending region 22, the first direction intersects the second direction.

The method includes: fabricating the functional film layer 30 on the substrate 10, where the functional film layer includes the non-hollowed region located in at least one of the first bending region 21 and the second bending region 22, and a part of the functional film layer 30 located in the third bending region 23 includes a plurality of functional via holes spaced from each other 300.

To be specific, in a possible embodiment, the substrate may be a flexible substrate, for example, the substrate includes a polyimide (PI) substrate.

For example, the first direction includes a direction of being bent to left or right with a Y direction as an axis of rotation, and the second direction includes a direction of being bent up or down with an X direction as an axis of rotation. The first bending region 21 may be bent to left or right along the first direction, and specifically include a left bezel region and a right bezel region of the display panel. The second bending region 22 may be bent up or down along the second direction, and specifically include an upper bezel region and a lower bezel region of the display panel. The third bending region 23 may be bent simultaneously both along the first direction and the second direction, and specifically include four corner regions of the display panel, i.e., an upper left corner region, a lower left corner region, an upper right corner region and a lower right corner region The display panel includes the functional film layer 30. The functional film layer 30 may specifically include, but be not limited to, a conductive pattern and/or an inorganic insulation film layer.

For example, the functional film layer includes the non-hollowed region located in at least one of the first bending region 21 and the second bending region 22. The functional film layer includes the hollowed region located in at least one of the first bending region 21 and the second bending region 22. A part of the functional film layer 30 located in the third bending region 23 includes the plurality of functional via holes spaced from each other 300 that form the hollowed region in the third bending region 23.

In the display panel manufactured by using the method of the embodiment of the present disclosure, a part of the functional film layer 30 located in the third bending region 23 is set to include the plurality of functional via holes spaced from each other 300, such that the functional film layer 30 may well release the stress generated in the third bending region 23, thereby effectively reducing a probability of cracks occurring and cracks transmitting in the functional film layer 30 in the third bending region 23. Therefore, the reliability of the functional film layer 30 in the double bending region (i.e., the third bending region 23) is improved in the display panel manufactured by using the method of the embodiment of the present disclosure, thereby facilitating the achievement of a special shape and appearance and the improvement of reliability of the display panel.

It should be appreciated that, each embodiment in the specification is described in a progressive manner, and same or similar parts between various embodiments may be referred to among the embodiments. Each embodiment focuses on the differences from other embodiments. In particular, as for the method embodiment, since it is basically similar to the product embodiment, the method embodiment is described relatively simply, and the relevant part may be referred to in the description of the product embodiment.

Unless defined otherwise, technical or scientific terms used in the present disclosure shall have general meanings as understood by those with ordinary skills in the art. Terms "first", "second" and similar terms used in the present disclosure do not indicate any order, quantity or priority, but are used only for distinguishing different components. An expression such as "include" or "have" indicates that a component or article preceding the term encompasses components, articles or other equivalents listed after the term, without excluding other components or articles. A term "connect", "couple", "attach" or other term with similar meaning is not limited to a physical connection or a mechanical connection, but may include an electrical connection, whether direct or indirect. "Up", "down", "left", "right" and the like are only used to represent a relative position relationship. When an absolute position of a described object is changed, the relative position relationship may also change correspondingly.

It should be appreciated that, when a component such as a layer, film, region or substrate is referred to as being located "above" or "below" another component, the component may be "directly" located "above" or "below" another component, or intermediary components may exist.

In the description of the foregoing embodiments, specific features, structures, materials, or characteristics may be combined in a suitable manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims

What is claimed is:

1. A display panel, comprising: a substrate, a functional film layer arranged on the substrate, a first bending region capable of being bent along a first direction, a second bending region capable of being bent along a second direction, and a third bending region located between the first bending region and the second bending region,
   wherein the first direction intersects the second direction, the functional film layer comprises a non-hollowed region located in at least one of the first bending region and the second bending region, and a part of the functional film layer located in the third bending region comprises a plurality of functional via holes spaced from each other,
   wherein the functional film layer comprises a first conductive pattern, the first conductive pattern comprises a plurality of first conductive via holes located in at least one of the first bending region, the second bending region and the third bending region, and
   wherein the functional film layer further comprises: a first inorganic layer stacked with the first conductive pattern, the first inorganic layer comprises a plurality of first inorganic via holes located in at least one of the first bending region, the second bending region and the third bending region, and an orthographic projection of each of the plurality of first inorganic via holes on the substrate does not overlap with an orthographic projection of each of the plurality of first conductive via holes on the substrate.

2. A method of manufacturing a display panel, wherein the display panel comprises a first bending region capable of being bent along a first direction, a second bending region capable of being bent along a second direction, and a third bending region located between the first bending region and the second bending region, the first direction intersects the second direction, the method comprises:
   fabricating a functional film layer on a substrate, wherein the functional film layer comprises a non-hollowed region located in at least one of the first bending region and the second bending region, and a part of the functional film layer located in the third bending region comprises a plurality of functional via holes spaced from each other,
   wherein the functional film layer comprises a first conductive pattern, the first conductive pattern comprises a plurality of first conductive via holes located in at least one of the first bending region, the second bending region and the third bending region, and
   wherein the functional film layer further comprises: a first inorganic layer stacked with the first conductive pattern, the first inorganic layer comprises a plurality of first inorganic via holes located in at least one of the first bending region, the second bending region and the third bending region, and an orthographic projection of each of the plurality of first inorganic via holes on the substrate does not overlap with an orthographic projection of each of the plurality of first conductive via holes on the substrate.

3. The display panel according to claim 1, wherein, along an direction perpendicular to an extension direction of the first conductive pattern, a width of the first conductive pattern in the third bending region is larger than both a width of the first conductive pattern in the first bending region and a width of the first conductive pattern in the second bending region.

4. The display panel according to claim 1, further comprising an inlet line region, wherein along a direction approaching the inlet line region, a width of the first conductive pattern along the first direction gradually increases.

5. The display panel according to claim 1, further comprising an outlet line of a data line, wherein an orthographic projection of the outlet line of the data line on the substrate and an orthographic projection of the functional film layer on the substrate overlap with each other in a second overlapping region, and the second overlapping region is located in at least one of the first bending region, the second bending region and the third bending region.

6. The display panel according to claim 1, further comprising a transistor, wherein a source electrode and a drain electrode of the transistor are arranged in a same layer as the first conductive pattern.

7. The display panel according to claim 1, wherein a diameter of each of the plurality of functional via holes in the third bending region along a third direction is identical to a diameter of each of the plurality of functional via holes in the third bending region along a fourth direction.

8. The display panel according to claim 1, wherein a part of the functional film layer located in the first bending region comprises a plurality of functional via holes spaced from each other, and a diameter of each of the plurality of functional via holes in the first bending region along a third direction is larger than a diameter of each of the plurality of functional via holes in the first bending region along a fourth direction.

9. The display panel according to claim 8, wherein the plurality of functional via holes comprise a first via hole and a second via hole, and along the fourth direction, a diameter of the first via hole is different from a diameter of the second via hole.

10. The display panel according to claim 1, wherein a part of the functional film layer in the second bending region comprises a plurality of functional via holes spaced from each other, and a diameter of each of the plurality of functional via holes in the second bending region along a fourth direction is larger than a diameter of each of the plurality of functional via holes in the second bending region along a third direction, and wherein the plurality of functional via holes comprise a third via hole and a fourth via hole, and along the third direction, a diameter of the third via hole is different from a diameter of the fourth via hole.

11. The display panel according to claim 1, wherein a part of the functional film layer located in the first bending region comprises a plurality of functional via holes spaced from each other, and the number of the functional via holes distributed in the first bending region gradually increases along a direction from the first bending region to the third bending region.

12. The display panel according to claim 1, wherein a part of the functional film layer located in the second bending region comprises a plurality of functional via holes spaced from each other, and the number of the functional via holes distributed in the second bending region gradually increases along a direction from the second bending region to the third bending region.

13. The display panel according to claim 1, wherein the functional film layer comprises a positive power signal line film layer or a negative power signal line film layer.

14. The display panel according to claim 1, wherein the functional film layer comprises a positive power signal line film layer and a negative power signal line film layer, and the display panel further comprises: a gate driving circuit, and an orthographic projection of the gate driving circuit on the substrate is located between an orthographic projection of the positive power signal line film layer on the substrate and an orthographic projection of the negative power signal line film layer on the substrate.

15. The display panel according to claim 1, wherein the third bending region is a transition region from the first bending region to the second bending region.

16. A display device comprising the display panel according to claim 1.

17. The display panel according to claim 1, wherein the functional film layer further comprises: a first organic layer and a second conductive pattern, the first organic layer is located between the first conductive pattern and the second conductive pattern, the second conductive pattern comprises a plurality of second conductive via holes located in at least one of the first bending region, the second bending region and the third bending region, and an orthographic projection of each of the plurality of first conductive via holes on the substrate does not overlap with an orthographic projection of each of the plurality of second conductive via holes on the substrate.

18. The display panel according to claim 17, wherein an orthographic projection of the first conductive pattern on the substrate and an orthographic projection of the second conductive pattern on the substrate overlap with each other in a first overlapping region, the first conductive pattern and the second conductive pattern are coupled to each other in the first overlapping region, and an orthographic projection of the first overlapping region on the substrate does not overlap with an orthographic projection of the third bending region on the substrate.

* * * * *